United States Patent
English et al.

(10) Patent No.: US 11,693,029 B2
(45) Date of Patent: Jul. 4, 2023

(54) METHODS AND ASSEMBLIES FOR TUNING ELECTRONIC MODULES

(71) Applicant: NXP USA, Inc., Austin, TX (US)

(72) Inventors: Joshua Bennett English, Gilbert, AZ (US); Lu Wang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/378,349

(22) Filed: Jul. 16, 2021

(65) Prior Publication Data
US 2023/0014716 A1    Jan. 19, 2023

(51) Int. Cl.
  *G01R 1/04*     (2006.01)
  *G01R 1/067*    (2006.01)
  *G01R 1/073*    (2006.01)
  *G01R 31/28*    (2006.01)

(52) U.S. Cl.
  CPC ..... *G01R 1/07335* (2013.01); *G01R 31/2808* (2013.01); *G01R 1/06766* (2013.01)

(58) Field of Classification Search
  CPC .......... G01R 1/04; G01R 1/067; G01R 1/073; G01R 31/02; G01R 31/28; G01R 31/2808
  See application file for complete search history.

(56) References Cited

U.S. PATENT DOCUMENTS

| | | | |
|---|---|---|---|
| 2006/0043581 A1 | 3/2006 | Prokofiev | |
| 2009/0058425 A1* | 3/2009 | Bartley | ............... H05K 1/0268 |
| | | | 324/555 |

* cited by examiner

*Primary Examiner* — Neel D Shah

(57) ABSTRACT

Evaluation board (EVB) assemblies or stacks utilized in tuning electronic modules are disclosed, as are methods for tuning such modules. In embodiments, the module testing assembly includes an EVB and an EVB baseplate. The EVB includes, in turn, an EVB through-port extending from a first EVB side to a second, opposing EVB side; and a module mount region on the first EVB side and extending about a periphery of the EVB through-port. The module mount region is shaped and sized to accommodate installation of a sample electronic module provided in a partially-completed, pre-encapsulated state fabricated in accordance with a separate thermal path electronic module design. A baseplate through-port combines with the EVB through-port to form a tuning access tunnel providing physical access to circuit components of the sample electronic module through the EVB baseplate from the second EVB side when the sample electronic module is installed on the module mount region.

19 Claims, 7 Drawing Sheets

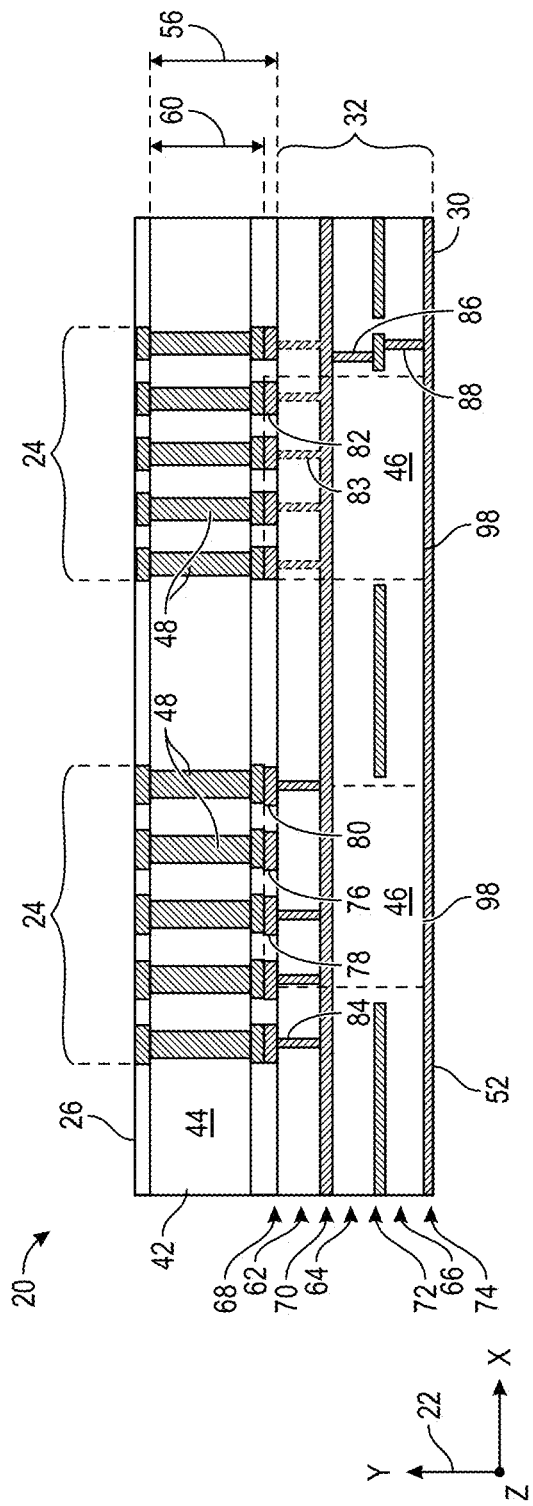
FIG. 2
FIG. 3
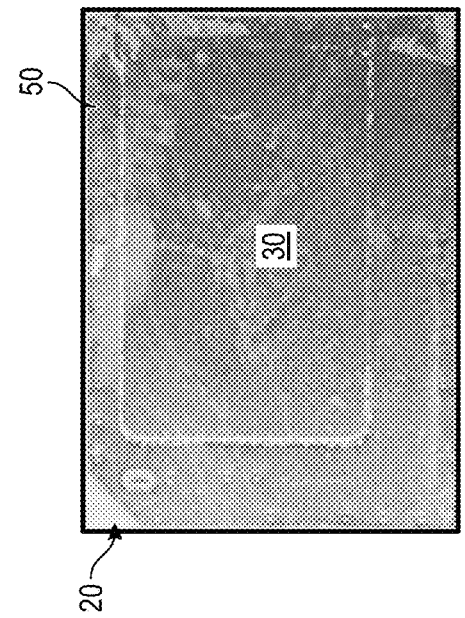
FIG. 4

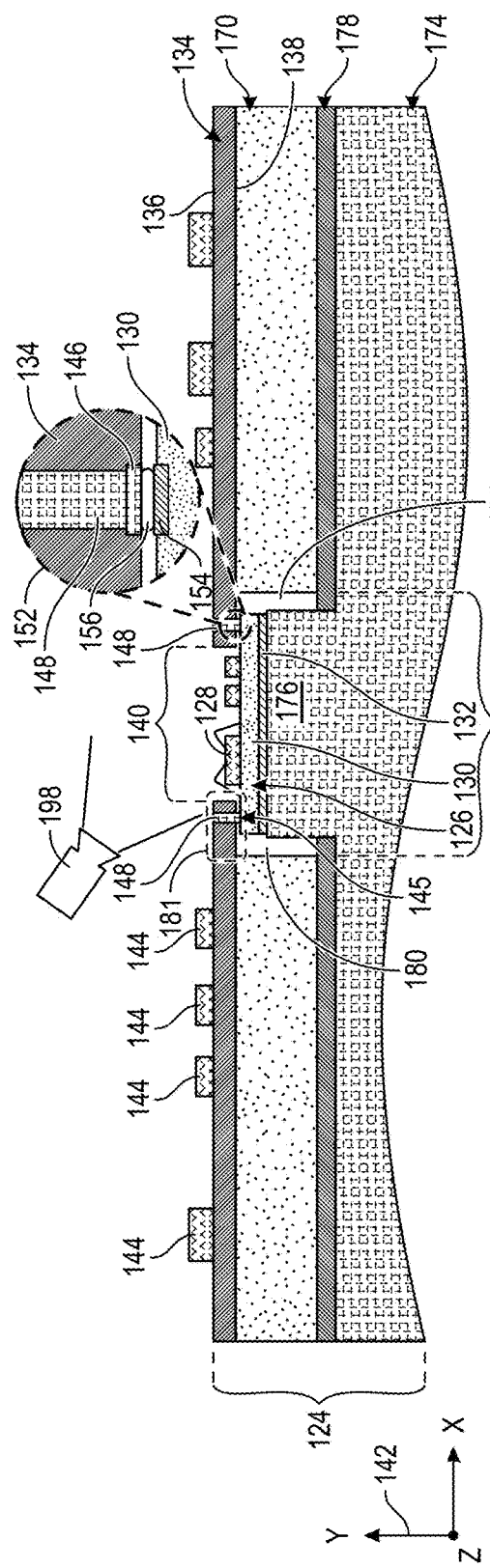
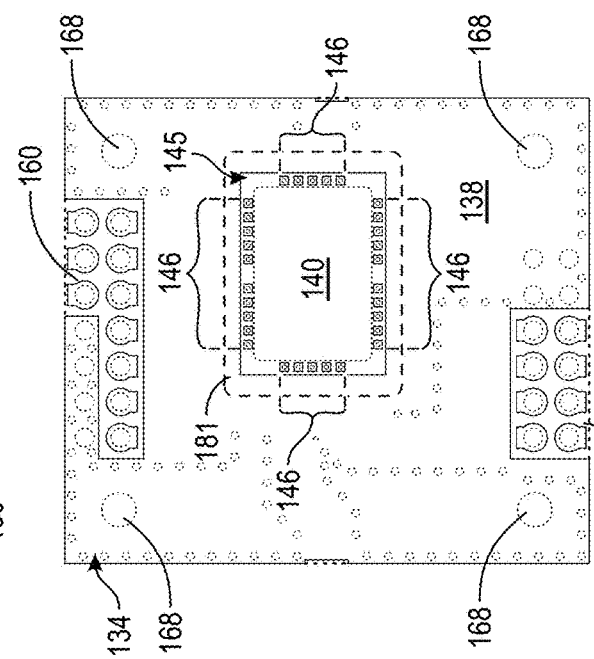
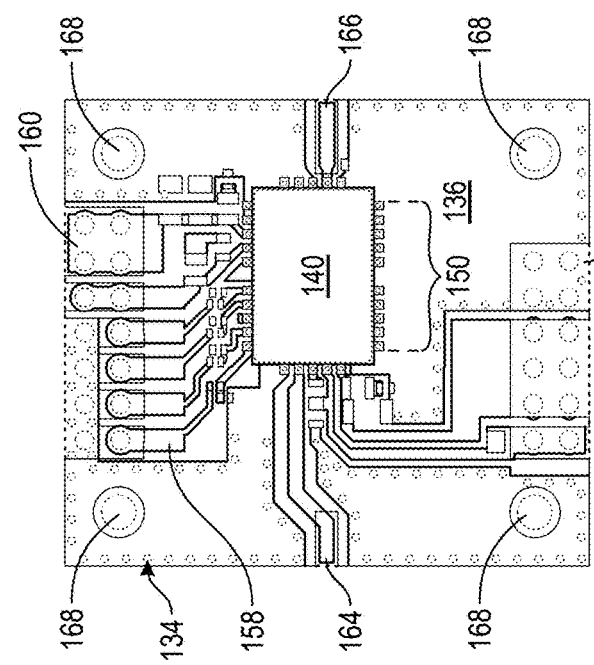

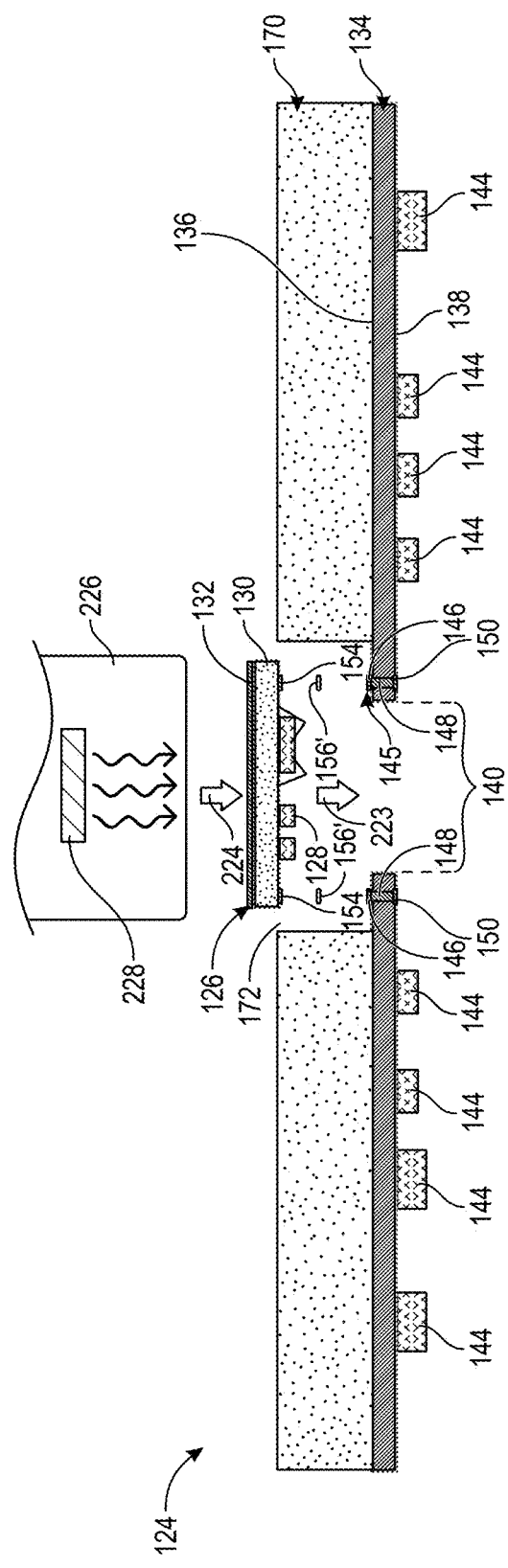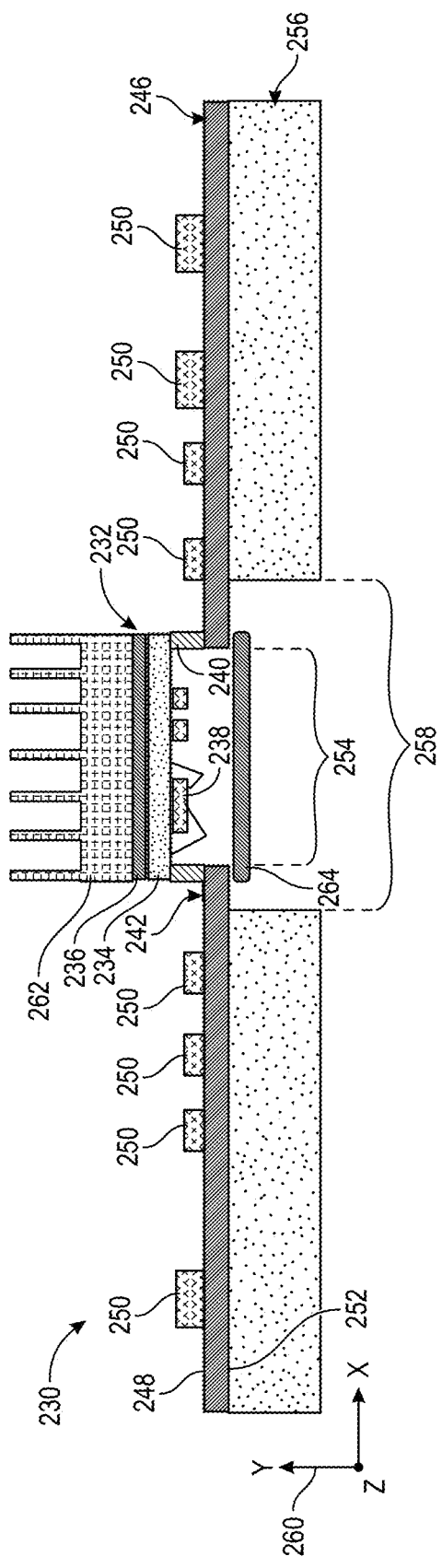

METHODS AND ASSEMBLIES FOR TUNING ELECTRONIC MODULES

TECHNICAL FIELD

Embodiments of the present disclosure relate generally to microelectronics and, more particularly, to methods and module testing assemblies for tuning power amplification modules and other electronic modules.

ABBREVIATIONS

Abbreviations appearing relatively infrequently in this document are defined upon initial usage, while abbreviations appearing more frequently in this document are defined below:
 IC—integrated circuit;
 I/O—input/output;
 PAM—power amplifier module;
 PCB—printed circuit board;
 RF—radio frequency;
 SMD—surface mount device; and
 STP—separate thermal path.

BACKGROUND

By common design, an electronic module contains a module substrate, such as a multi-layer PCB, to which various semiconductor dies and other components are attached. As a specific example, a PAM is a type of electronic module including a module substrate to which one or more RF power dies are attached; that is, semiconductor dies bearing transistor ICs utilized for RF signal or power amplification purposes. Other interconnected circuit components are also commonly installed on the populated side of the module substrate in the form of additional dies and passive SMDs. In many instances, the module substrate and the circuit components are encased in an encapsulant, such as a globtop epoxy, while the terminals (contact pads) of the PAM are exposed along a substantially planar mount surface of the electronic module when imparted with certain surface mount (e.g., a flat, no-lead or grid array) formfactors. To enhance thermal performance, at least one low thermal resistance path may be provided between the power die or dies contained within the PAM and an outer metallized or metal-containing surface, which is substantially co-planar with an outer principal surface of the electronic module and which serves as a thermal (heat extraction) interface. For example, in one common architecture, the RF power dies are mounted to metallic coins, which are embedded in the module substrate and which extend to an outer plated metal layer or multi-layer system of the electronic module. When the PAM is installed on a motherboard or other substrate contained in a larger electronic system, the thermal interface is placed in thermal communication or connection with a system-level heatsink to enhance dissipation of excess heat generated by the circuit components (particularly, the RF power dies) during operation of the PAM.

BRIEF DESCRIPTION OF THE DRAWINGS

At least one example of the present invention will hereinafter be described in conjunction with the following figures, wherein like numerals denote like elements, and:

FIG. 2 is a side cross-sectional view of the example electronic module shown in FIG. 1, as taken along a section plane 2-2 identified in FIG. 1 and depicted in a completed, fully-encapsulated state;

FIGS. 3 and 4 are inboard side and outboard side (system top) planform images, respectively, of a real-world electronic module reduced to practice and corresponding to the example electronic module shown in FIGS. 1 and 2;

FIG. 5 is a simplified cross-sectional schematic of a module testing assembly and a sample electronic module, which is provided in a partially-completed, pre-encapsulated state, fabricated in accordance with an electronic module design, and mounted to the non-populated underside of an EVB contained in the module testing assembly, as illustrated in accordance with an example embodiment of the present disclosure;

FIGS. 6 and 7 are top and bottom planform views, respectively, of the EVB included in the example module testing assembly shown in FIG. 5, as depicted in isolation prior to circuit board population and RF connector attachment;

FIG. 11 illustrates, as a simplified cross-section, an example manner in which a sample electronic module may be mounted to the EVB underside by hotplate-induced solder reflow during the example tuning method set-forth in FIG. 10; and FIG. 12 is a simplified cross-sectional schematic of a module testing assembly and a sample electronic module, which is provided in a partially-completed, pre-encapsulated state and which is mounted to the frontside of an EVB contained in the module testing assembly, as illustrated in accordance with a further example embodiment of the present disclosure.

Figure 1:
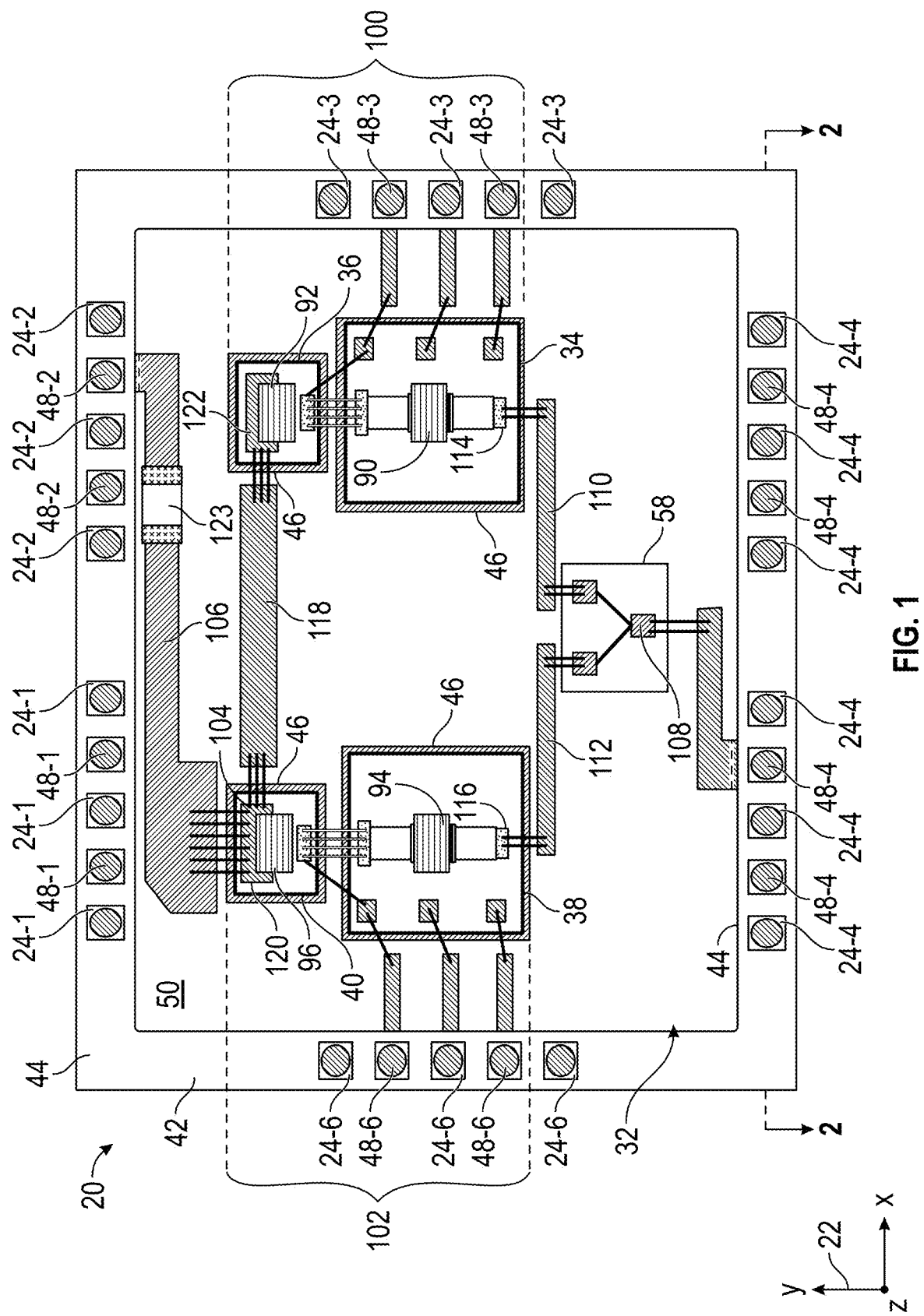
FIG. 1 is a simplified top-down or planform view of an electronic module (here, a PAM) having a land grid array formfactor, as shown in a pre-encapsulated state and fabricated in accordance with an example electronic module design.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims. As appearing herein, the term "tuning" encompasses the term "testing," particularly electrical and/or thermal testing of an electronic (e.g., power amplifier) module of the type described herein. Additionally, the term "metallic" refers to a material principally composed of at least one metal constituent, by weight, and potentially containing additional non-metallic constituents. Similarly, reference to a material as being composed of a particular metal, such as aluminum (Al), copper (Cu), or nickel (Ni), indicates that the material is predominately composed of the named metal by weight, but may contain lesser amounts of other metallic or non-metallic constituents.

Separate Thermal Path Electronic Modules and Terms of Orientation

The term "separate thermal path electronic module" or "STP electronic module," as appearing throughout this document, refers to an electronic module, such as a power amplification module or "PAM," in which a primary heat extraction interface is provided through a first principal surface of the electronic module. This first principal surface (through which the primary thermal path or heat extraction interface extends) may correspond to the topside of a larger system or assembly in which the electronic module is deployed. The principal thermal or heat dissipation path is "separate" in the sense that this thermal path is physically offset from (e.g., deviates in an opposite direction from) the signal-carrying electrical paths and I/O interface of the electronic module, as discussed below. This should be contrasted with conventional electronic module designs, such as conventional PAM designs, in which the primary thermal (heat dissipation) path and the module I/O interface are provided on the same side or principal surface of the electronic module.

As just noted, in the context of the below-described STP electronic modules, the primary heat extraction path is provided through a first principal surface of the electronic module, which may correspond to the topside of a larger system or assembly in embodiments. In this context, the "topside" of the larger system is defined relative to the proximity of motherboard or other electrically-routed substrate to which the STP electronic module is mounted (generally referred to herein as a "system-level substrate"). For clarity, the term "inboard side" is utilized to further refer to the principal surface of an electronic module facing the system-level substrate when the electronic module is installed in a larger microelectronic system. Conversely, the term "outboard side" refers to the principal surface of an electronic module facing away from the system-level substrate when the electronic module is installed within a larger microelectronic system. The outboard side (or system topside) of an STP electronic module can face in any direction in three-dimensional space, providing that the electronic module outboard side faces away from the system-level substrate to which the STP electronic module is mounted. One example of an STP electronic module discussed herein is an STP PAM. However, those of skill in the art would understand, based on the description herein, that the various embodiments discussed herein may apply to a variety of different types of electronic modules in addition to electronic modules, including electronic modules having other heat dissipation architectures.

Generally, in the case of an STP electronic module, a primary thermal (heat extraction) interface is availed along the outboard side of the electronic module and is consequently referred to as an "outboard thermal interface." Conversely, the I/O interface of the STP electronic module is predominately, if not entirely provided at another location or combination locations on the electronic module, noting that the metallic surface or surfaces defining the electronic module thermal interface of can also serve as a ground terminal of the electronic module in certain cases. As described in detail below, the I/O interface of an STP electronic module is often principally, if not exclusively formed along the inboard side of the electronic module opposite the outboard thermal interface. The terminals (e.g., contact pads) of the electronic module are accessible from and may be substantially coplanar with the electronic module inboard side to impart the electronic module with a surface mount formfactor, such as a dual flat no-lead (DFN), a quad flat no-lead (QFN), or a land grid array (LGA) formfactor. When a surface mount (e.g., a flat no-lead or grid array) STP electronic module is mounted to a motherboard or other system-level substrate, the contact pads defining the inboard I/O interface are electrically joined (e.g., soldered) to corresponding contact pads provided on the system-level substrate. Comparatively, the outboard thermal interface may be placed in thermal communication with a heatsink (e.g., a metal chassis or fin array) included in the larger microelectronic system to promote conductive heat extraction from the STP electronic module and provide a "topside cooling" function of the electronic module. By contrast, in the case of a conventional (non-STP) electronic module having a surface mount (e.g., a flat no-lead or grid array) formfactor, both the thermal interface and the I/O interface of the electronic module are typically provided along the inboard (substrate facing) side of the electronic module.

Overview

The following describes methods and unique structural assemblies for tuning electronic modules, such PAMs and other electronic modules having STP designs. This may also be described as testing and modifying STP electronic module designs to arrive a finalized STP electronic module design suitable for usage in the production of STP electronic modules on a commercial scale. For reasons that will become apparent, the presently-disclosed structural assemblies module testing assemblies or evaluation board stacks, with the term "evaluation board" abbreviated as "EVB" below. An industrial need arises for methods and module testing assemblies adapted for tuning STP electronic modules, particularly given the unique architecture of such STP electronic module designs. This may be appreciated by initially considering, for purposes of comparison, the general architecture of a conventional (non-STP) electronic module architecture having a flat surface mount (e.g., a flat no-lead or grid array) formfactor. In the case of such a conventional (non-STP) electronic module, both the thermal (heat extraction) interface and the I/O interface are typically availed alongside the inboard side (substrate-facing surface) of the electronic module. For example, a central region of the electronic module inboard side may be occupied by a metallic surface having a generally rectangular planform shape and serving as an inboard thermal interface, while contact pads are distributed in rows about an outer periphery of the electronic module inboard side and flank the edges of the electronic module thermal interface. The electronic module may further include an encapsulant body, which is composed of a globtop epoxy or another (e.g., molded plastic) dielectric material, encasing the circuit components contained in the electronic module and having an outer principal surface substantially coplanar with and partly defining the electronic module inboard side. The thermal interface and the contact pads, which define an inboard I/O interface of the electronic module, are exposed along the inboard side of the electronic module for mechanical, electrical, and thermal coupling to a system-level substrate.

In developing and commercially-implementing new electronic module designs, one or more entities often engage in an iterative tuning process beginning with the production of at least one sample (tuning) electronic module, which is fabricated in accordance with an initial (beta) version of a newly-proposed electronic module design. The sample electronic module is furnished in a pre-encapsulated state to allow ready access to the RF power dies and other circuit components contained in the electronic module during the tuning process. The sample electronic module is installed on a system-level substrate, such as a multi-layer motherboard, similar or identical to the system-level substrate on which production-run electronic modules (electronic modules fabricated in accordance with a finalized version of the electronic module design) are ultimately installed. During each iteration of the tuning process, an RF input signal is applied to the sample electronic module through the system-level substrate, while electrical characteristics of the RF output signal generated by the sample electronic module are measured. From these electrical measurements, various key characteristics pertaining to the sample electronic module can be assessed and compared to target ranges; e.g., target ranges specifying desired power levels, gain, thermal limits, efficiency characteristics, linearization characteristics, and operational frequency ranges ideally achieved before finalizing the electronic module design. After each testing iteration, adjustments or modifications may be made to electronic module circuitry in a manner fine tuning the measured characteristics, with this cycle of testing and circuit modification repeated as appropriate to iteratively tune the electronic module design until the target specifications are satisfied; or, perhaps, until a new sample electronic module is manufactured for further testing and tuning. Depending upon testing results, modifications may be performed to alter SMD characteristics (e.g., by shifting SMD positioning within the electronic module or by replacing existing SMDs with new SMDs having varying values), to modify wirebond characteristics (e.g., by plucking existing wirebonds and creating new wirebonds having varying lengths, loop heights, or array spacings), or to vary other physical features of the electronic module circuitry. Thermal analysis may also be conducted to ensure that excessively high local temperatures or "hot spots" are reduced, if not eliminated across the electronic module circuit architecture, often with a particular focus on local wirebond and the RF power die temperatures.

When the electronic module design or model is then finalized, production-scale batches of the STP electronic modules, such as STP PAMs, may be manufactured in accordance with final electronic module design and installed within larger microelectronic systems or assemblies. In many instances, a first entity (a supplier) provides the production-scale electronic modules to a second entity (a customer acting as an original equipment manufacturer), which installs the electronic modules on the motherboards (or other system-level substrates) during a manufacturing process. In conjunction with or prior to provision of the production-scale electronic modules, the first entity (the supplier) may also provide a sample board to the second entity (the customer) for evaluation purposes, with the first entity (the supplier) tuning the electronic modules as needed and providing information (e.g., thermal scan information) to the second entity (the customer) per request Various other scenarios are also possible in which a single entity performs the above-described tuning steps or any number of entities cooperate in a collaborative fashion to perform the above-described steps involved in refining an initial electronic module design utilizing one or more sample (tuning) electronic modules to arrive at a final, production-ready electronic module design or model.

Ideally, the apparatus or set-up utilized in the electronic module tuning process closely emulates the real-world operational environment and application in which the finalized, production-run electronic modules are ultimately deployed. This can be achieved with relative ease in the case of many conventional, non-STP electronic module designs. In this instance, a sample electronic module utilized for tuning purposes may be manufactured in accordance with an initial non-STP electronic module design, but left unencapsulated and soldered to the system-level substrate per typical practice. Given that the thermal and I/O interfaces of such an electronic module (here, having a non-STP architecture and an LGA formfactor) are present along the electronic module inboard side (the substrate-facing surface of the electronic module), the sample electronic module can be mounted to the system-level substrate in the usual manner, while requiring relatively few, if any modifications to the system-level substrate. Consequently, through the tuning process, the electrical and thermal performance of the sample electronic module will typically closely correspond with electronic module performance in the real-world application under consideration. Concurrently, the RF power dies and other circuit components present along the populated-side of the electronic module substrate (herein, the outboard side) can be readily accessed, replaced, or physical manipulated as desired as the unencapsulated sample electronic module is subject to tuning.

While the process outlined above is well-suited for tuning surface mount (e.g., flat no-lead or grid array) electronic modules possessing conventional (non-STP) designs, such an approach is generally unsuitable or impractical for usage in tuning electronic modules imparted with STP architectures and surface mount (e.g., flat no-lead or grid array) formfactors. When fabricated to have an STP architecture and a surface mount formfactor, a given electronic module is mounted to a motherboard or other system-level substrate in an inverted orientation relative to a conventional (non-STP) electronic module. Given the inverted orientation of the STP electronic module, the module substrate physically blocks access to the circuitry of the STP electronic module from the electronic module outboard side (the principal surface facing away from the system-level substrate), regardless of whether the STP electronic module is provided in a non-encapsulated state. Further, as discussed more fully below, STP electronic module designs commonly incorporate one or more interposer pieces, which provide vertical electrical connections (e.g., filled or plated vias) extending from a module substrate to contact pads defining an inboard I/O interface of the STP electronic module; the term "vertical," as appearing herein, referring to direction along an axis extending substantially orthogonal to the electronic module inboard side and the electronic module outboard side (also referred to as a "thickness direction" of the electronic module).

The above-mentioned interposer piece or pieces may be attached to an electronic module prior to encapsulation, with the below-described testing and tuning processes potentially performed prior to or after interposer piece attachment. When present, such an interposer piece or pieces further block physical access to the electronic module circuit components from the outer periphery of the STP electronic module, introducing further difficulty in accessing the circuit components for tuning purposes. So too is line-of-sight to the electronic module circuitry impeded due to the structural nature of the STP electronic module architecture, which renders comprehensive thermal analysis impractical utilizing conventional testing set-ups. Due to such technical challenges, an industrial demand persists for the provision of novel techniques and structural assemblies for tuning STP electronic module designs from electrical and thermal perspectives. Ideally, such techniques and assemblies wound enable STP electronic module tuning in an efficient, cost effective manner, while simulating the real-world operating environment of the electronic module when deployed into its intended application in a highly realistic or accurate manner.

In keeping with the above-described industry demand, the following discloses unique structural assemblies and methods for tuning STP electronic module designs, including STP electronic module designs having surface mount (e.g., flat no-lead or grid array) formfactors. Such structural assemblies or tuning set-ups contain an electrically-routed substrate, which emulates a motherboard or other system-level substrate contained in the final electronic module application and which is referred to herein as an "evaluation board" or, more simply, as an "EVB." The EVB is combined with other structural components to produce a specialized set-up or apparatus for STP electronic module tuning, which is referred to as an "module testing assembly." A sample STP electronic module, which may be provided in a partially-fabricated, pre-encapsulated state fabricated in accordance with an STP electronic module design, is installed in the module testing assembly and subject to tuning, while the circuit components of the STP electronic module remain readily accessible for electrical tuning, thermal tuning, or both. The EVB itself includes a relatively large aperture or opening, referred to herein as the "EVB through-port," which extends between the opposing principal surfaces of the EVB to penetrate the EVB in a thickness direction. The EVB also includes at least one module mount region, which extends around a periphery of the EVB through-port; as well as a number of EVB contact pads, which are distributed about the module mount region in, for example, rows flanking the EVB through-port. The module mount region is shaped and sized to accommodate installation of a sample electronic module, which is provided in a partially-completed, pre-encapsulated state fabricated in accordance with the STP electronic module design; e.g., the module mount region may be dimensioned to substantially match the outer peripheral footprint of the electronic module. In embodiments, such a sample electronic module may be provided at a stage of manufacture prior to interposer attachment, with the ring-shaped portion of the EVB vertically overlapping or underlying the module mount region to effectively mimic the interposer piece or pieces contained in the final electronic module design.

Embodiments of the module testing assembly may further include an EVB baseplate, which is sized and shaped to physically support the EVB along its underside and which has a second relatively large aperture referred to herein as a "baseplate through-port." When the module testing assembly is fully assembled, the baseplate through-port overlaps with the EVB through-port in a vertical (thickness) direction and may be substantially co-axial or vertically-centered therewith, although this is not necessary in all instances. Due to this structural configuration, when a sample electronic module is installed in the module testing assembly, the baseplate through-port combines with the EVB through-port to form a tuning access tunnel providing physical access to circuit components of the sample electronic module through the EVB baseplate and from a given side or principal of the EVB; e.g., either from the EVB frontside or underside, depending upon implementation as discussed below. A testing assembly heatsink is further contained in embodiments of the module testing assembly to, for example, emulate or model the assembly-level heatsink and thermal performance of the STP electronic module in the intended final application. In this regard, embodiments of the module testing assembly may include a so-called "pedestal heatsink" featuring a raised mesa region, which is dimensioned to extend into the baseplate through-port to contact the outboard side of the sample electronic module subsequent to mounting of the sample electronic module to the EVB. Further, in such embodiments, the module testing assembly may also include: (i) a dielectric layer between the EVB baseplate and the pedestal heatsink, as well as (ii) a peripheral air gap generally located between the raised mesa region of the pedestal heatsink and the inner walls of the EVB baseplate defining the baseplate through-port. In such embodiments, the peripheral air gap and the dielectric layer may cooperate to electrically isolate the pedestal heatsink from the EVB baseplate when the module testing assembly is assembled.

In certain embodiments, the sample STP electronic module may be mounted to a backside or underside of the EVB (that is, the side of the EVB facing the EVB baseplate) in a manner mirroring the mount location in which a production electronic module is installed on a system-level substrate (e.g., a motherboard) corresponding to the EVB. This "mirrored" spatial relationship may be appreciated considering that, in the context of a production-run microelectronic system, a completed, fully-encapsulated STP electronic module is mounted to the system-level substrate at a designated mount location; e.g., an "X, Y" location in which X and Y denote perpendicular axes extending parallel to the populated frontside of the system-level substrate. Further, contact pads included in the inboard I/O of the completed electronic module may be soldered or otherwise electrically coupled to the corresponding contacts of the system-level substrate, with the electronic module inboard side facing the populated frontside side of the system-level substrate. Comparatively, in the case of a module testing assembly employing a mirrored mounting scheme, the sample electronic module (again, provided in a partially-fabricated state prior to interposer attachment and encapsulation) is mounted to and faces the non-populated underside or backside of the EVB. In this case, the X, Y location of the sample electronic module on the EVB is identical, or at least substantially identical, to the X, Y location of a finalized electronic module when mounted to the system-level substrate. The Z-axis or vertical position of the sample electronic module (here, the Z-axis representing a third axis orthogonal to the X- and Y-axes) is shifted to locate the sample electronic module on the opposite side of the EVB, while the orientation of the sample electronic module inverted or "flipped" relative to the orientation of a finalized electronic module in the completed assembly or system. To allow the sample electronic module to be so positioned, the baseplate through-port is imparted with planform dimensions (e.g., a length and width) greater than those of the EVB through-port, with the sample electronic module received into the baseplate through-port when mounted to the underside of the EVB. Such a structural arrangement creates an encroaching, overhang region of the EVB, which extends over the EVB through-port to partially cover the EVB through-port, as seen from the populated frontside of the EVB. The sample electronic module is mounted to the EVB in a manner covering the EVB through-port, as viewed from the underside of the EVB, with the EVB through-port providing physical access to the non-encapsulated circuitry of the sample electronic module via the EVB through-port from the EVB frontside.

In embodiments in which the sample electronic module is attached to the EVB in a mirrored mounting arrangement, the overhang region of the EVB (vertically aligned with the EVB mount region as taken along a vertical axis parallel to the above-mentioned Z-axis) may generally emulate one or more interposer pieces contained in the final STP electronic module design. In this regard, vertical electrical connections (e.g., filled vias referred to as "via ups") may be extend vertically through this EVB region from the EVB contact pads distributed within the EVB mount region to the EVB frontside. In embodiments, the via ups may terminate at contact pads or similar contacts provided on the EVB frontside, which mimic the contact pads to which a production-run electronic module mount in the context of the system-level substrate corresponding to the EVB. The electrical routing or trace wiring scheme, considered moving peripherally outward from this region of the EVB, may be substantially identical to the trace routing scheme in the system-level substrate. Effectively, then, the via ups may mimic the electrical performance characteristics of the vertical electrical connections within one or more interposer pieces included in the electronic module STP design. Solder connections can also readily be formed between the interfaces or junctures between the contact pads distributed about the module mount region of the EVB and an interposer contact region of the sample electronic module; that is, the region of the sample electronic module bonded to one or more interposer pieces in the completed electronic module design. A highly representative electrical and thermal model of the STP electronic module in the final application (the intended operational environment) is thereby created through the provision of such a module testing assembly and sample STP electronic module, which lacks the interposer piece(s) and encapsulant present in a finalized version of the STP electronic module, but otherwise produced in accordance with the STP electronic module design subject to refinement via tuning. Concurrently, the EVB through-port enables ready physical and visual access to the circuitry of the sample electronic module to facilitate thermal and electrical tuning activities.

In alternative embodiments, the module testing assembly may instead be structurally configured to mount a sample electronic module (again, provided in a partially-completed, pre-encapsulated state) to the populated frontside of the EVB in a non-inverted or non-mirrored orientation. Such a module testing assembly may still include an EVB having an EVB through-port, as well as an EVB baseplate having baseplate through-port aligning or vertically overlapping with the EVB through-port when the module testing assembly is assembled. Again, the through-ports cooperate to yield a tuning access tunnel providing physical access to circuit components of the sample electronic module; in this case, from the non-populated EVB underside and through the EVB baseplate itself. Further description of such an alternative embodiment is provided below in connection with FIG. 12. Regardless of whether the module testing assembly accommodates mounting of a sample electronic module to the populated EVB frontside in a non-mirrored orientation or to the non-populated EVB backside in a mirrored orientation, the module testing assembly enables tuning of STP electronic module designs in a highly streamlined, cost-efficient manner well-suited for emulating the final operating environment of electronic modules fabricated in accordance with the finalized version of the STP electronic module design. Further description in this regard is provided below in connection with FIGS. 5-12, with an example method for tuning an STP electronic module design utilizing a module testing assembly specifically set-forth below in connection with FIG. 10. Prior to this, an example STP electronic module is described in connection with FIGS. 1-4 to establish a non-limiting illustrative context in which embodiments of the present disclosure may be better understood. While the below-described example STP electronic module has a particular design or architecture (namely, a particular Doherty amplifier architecture and an LGA formfactor), embodiments of the presently-disclosed tuning method can be advantageously utilized to tune a wide variety of electronic module, including both Doherty and non-Doherty (e.g., push-pull) amplifier designs having STP designs or architectures.

General Discussion of an Example Separate Thermal Path Electronic Module

FIGS. 1 and 2 are top planform and side cross-sectional views of a power amplifier module 20 (hereafter, "electronic module 20"), respectively, having a separate thermal path (STP) architecture and illustrated accordance with an example embodiment of the present disclosure, electronic module 20 is illustrated prior to encapsulation in FIG. 1 and following encapsulation in FIG. 2. Further, electronic module 20 is illustrated in an inverted orientation in FIG. 2 relative to orientation of electronic module 20 when installed on a system-level substrate, such as a motherboard. Accordingly, as identified in FIG. 2, principal surface or side 26 of electronic module 20 corresponds the inboard side (substrate-facing surface) of electronic module 20, while principal surface or side 30 corresponds to the outboard side of electronic module 20. As discussed more fully below, a thermal (heat extraction) interface is availed along outboard side 30 of STP electronic module 20 (the lower surface in FIG. 2), while an I/O interface is availed along inboard side 26 of electronic module 20 (the upper surface in FIG. 2). The inboard and outboard sides of STP electronic module 20 are spaced along the Y-axis of a coordinate legend 22 appearing in the lower left of FIG. 2, which is also referred to as a "vertical" or a "package thickness" direction herein.

FIGS. 3 and 4 present a real-world instance or actual implementation of STP electronic module 20 in a fully encapsulated, completed state, as seen from opposing sides. More specifically, FIG. 3 depicts inboard side 26 of STP electronic module 20, as seen from a top-down planform viewpoint In this view, several rows of electronic module contact pads 24 distributed about an outer periphery of outboard side 26 of electronic module 20 and encapsulant body 44 enclosing the circuit components of STP electronic module 20. Comparatively, FIG. 4 depicts outboard side 30 of STP electronic module 20 as seen from a planform viewpoint. Here, it can be seen that outboard side 30 of STP electronic module 20 is covered by a plated metal layer 50 (or multi-layer system) serving as an outboard thermal interface of electronic module 20. As noted above, when STP electronic module 20 is installed within a larger microelectronic system, the outboard thermal interface of STP electronic module 20 may further be placed in thermal communication (e.g., direct or indirect thermal contact) with a heatsink, a metal chassis, or a similar feature included in a larger microelectronic system to promote conductive heat extraction from electronic module 20 and provide the desired "system topside cooling" functionality; although it is possible to simply leave the outboard thermal interface exposed for convective heat dissipation to the surrounding environment for lower thermal performance applications.

Referring collectively to FIGS. 1-4, example STP electronic module 20 contains a module substrate 32, such as a multi-layer PCB; a plurality of power transistor dies 34, 36, 38, 40; and certain other electrical components. To establish electrical connections between dies 34, 36, 38, 40 and the other circuit components contained within STP electronic module 20, a plurality of column-like electrical connections extend from contacts or contact pads provided on the populated side of module substrate 32 to contact pads 24 exposed along inboard side 26 of STP electronic module 20, thereby forming the inboard side I/O interface of electronic module 20. Such column-like electrical connections (also referred to herein as "vertical electrical connections") can be provided in various other manners, including by placing discrete electrically-conductive (e.g., metallic) rod-like pieces utilizing a suitable fixture. For process efficiency, such vertical electrical connections are conveniently provided in the form of one or more interposer pieces, which contain a dielectric (e.g., ceramic or polymeric) body in which such vertical electrical connections are contained, whether as filled vias, plated vias, or as embedded electrically-conductive (e.g., Cu) bodies; the term "via" utilized herein to encompass all such structural elements providing electrical connections in a thickness direction (corresponding to the Y-axis of coordinate legend 22). In the illustrated example, specifically, a single interposer piece 42 having a generally rectangular ring-shaped geometry is utilized for this purpose and is referred to hereafter as "interposer ring 42." Interposer ring 42 containing a dielectric body 44, contact pads 24 arranged in six rows or groupings, and filled interposer vias 48 underlying contact pads 24. Interposer ring 42 is shaped and sized to extend around an outer periphery of a populated side 50 of module substrate 32, as further discussed below.

A plurality of components (including power transistor dies 34, 36, 38, 40) and interposer ring 42 are coupled to populated surface 50 of module substrate 32, and non-conductive encapsulant material 28 (e.g., a plastic encapsulant, such as an epoxy glob top) is disposed on populated surface 50. Encapsulant material 28 surrounds (extends over and around) the electrical components of electronic module 20 and interposer ring 42 to define a contact surface (corresponding to outboard side 26) of STP electronic module 20 on which the electronic module I/O interface is exclusively or at least principally provided. As identified in FIG. 2, encapsulant material 28 has a thickness 56 greater than the maximum height of the components (e.g., splitter 58 and power transistor dies 34, 36, 38, 40) covered by the encapsulant material 28. In some embodiments, this thickness (dimension 56) is substantially equivalent to the height (dimension 60) of interposer ring 42, although this thickness may be slightly less or greater than the height of interposer ring 42 in other embodiments. Lower or proximal surfaces of interposer ring 42, and more particularly proximal ends of the terminals (e.g., vias-in-pads 24, 48) embedded within interposer ring 42, may be coupled to conductive features on populated surface 50 of module substrate 32 in embodiments. Conversely, upper or distal surfaces of interposer ring 42, and more particularly distal ends of the terminals, are exposed at contact surface 54 of encapsulant material 28. Although not shown in FIG. 2, conductive attachment material (e.g., solder balls, solder paste, or conductive adhesive) is disposed on the exposed distal ends of the terminals to facilitate electrical and mechanical attachment of the electronic module 20 to a system-level substrate.

As depicted in FIG. 2, module substrate 32 includes a plurality of dielectric layers 62, 64, 66 (e.g., composed of FR-4, ceramic, or other PCB dielectric materials), in an alternating arrangement with a plurality of patterned metal layers 68, 70, 72, 74. Populated surface 50 of module substrate 32 is defined by a patterned metal layer 68, while non-populated surface 52 of module substrate 32 is defined by a patterned metal layer 74. While module substrate 32 is shown to include three dielectric layers 62, 64, 66 and four patterned metal layers 68, 70, 72, 74, other embodiments of a module substrate may include more or fewer dielectric layers and/or patterned metal layers. Each of the various patterned metal layers 68, 70, 72, 74 may have a primary purpose, and also may include conductive features facilitating signal and/or voltage/ground routing between other layers. Although the description below indicates a primary purpose for each of the patterned metal layers 68, 70, 72, 74, the layers (or their functionality) may be arranged differently from the illustrated arrangement. For example, in an alternative embodiment, patterned metal layer 68 at populated surface 50 of module substrate 32 may primarily function as a signal conducting layer. In this case, patterned metal layer 68 may include a plurality of conductive features (e.g., conductive pads and traces) serving as attachment points for dies 34, 36, 38, 40 and other discrete components, as well as providing electrical connectivity between dies 34, 36, 38, 40 and the other discrete components.

In the illustrated embodiment, patterned metal layer 68 includes a number of electrically-conductive pads (e.g., pads 76, 78, 80) designated for attachment of electrically conductive signal, bias, and/or ground terminals within interposer ring 42, patterned metal layer 68 may also include a plurality of "dummy" pads, such as pad 82, to which "dummy" terminals may be attached. As appearing herein, the term "dummy terminal" refers to an interposer terminal that is not assigned any particular function in an amplifier IC or electronic module and, thus, is not coupled to any active circuitry. In various embodiments, the dummy terminals and dummy pads 82 may be left electrically floating (that is, not coupled to ground or other circuitry); or, alternatively, may be coupled to a ground layer, such as ground layer 70 (indicated with optional dashed line vias 83). A second patterned metal layer 70 functions as an RF ground layer in an embodiment and may be patterned to include a plurality of conductive features, such traces. The conductive features of patterned metal layer 70 may be electrically coupled to various conductive features of patterned metal layer 68 (a signal conducting layer) and to patterned metal layer 74 (e.g., a system ground layer) with conductive vias 84, 86, 88 extending through dielectric layers 62, 64, 66. For example, conductive ground terminal pads 78, 80 may be electrically coupled through vias 84 to patterned metal layer 70 (the RF ground layer); while layer 70 is, in turn, electrically coupled through vias 86, 88 (and routing features of patterned metal layer 72) to patterned metal layer 74 (the system ground layer). A third patterned metal layer 72 functions to convey bias voltages to power transistors 90, 92, 94, 96 within dies 34, 36, 38, 40, and also may function as a routing layer, as mentioned above. Finally, a fourth patterned metal layer 74 functions as a system ground layer and also as a heatsink attachment layer in embodiments.

According to embodiments, module substrate 32 further includes one or more thermal dissipation structures 46, which extend between surfaces 26, 50 of module substrate 32. Dies 34, 36, 38, 40 are physically and electrically coupled to surfaces of thermal dissipation structures 46 exposed at outboard side 26 of the module substrate 32.

Bottom surfaces 98 of thermal dissipation structures 46 may be exposed at non-populated surface 52 of module substrate 32, or bottom surfaces 98 of thermal dissipation structures 46 may be covered with bottom patterned metal layer 74 or multi-layer system, as shown in FIG. 2. In either instance, thermal dissipation structures 46 provide a thermal pathway between dies 34, 36, 38, 40 and bottom surfaces 98 of thermal dissipation structures 46 and, therefore, non-populated surface 52 of module substrate 32. In various embodiments, thermal dissipation structures 46 may include conductive metallic coins press-fit and/or otherwise attached into through-holes extending between surfaces or sides 26, 50 of module substrate 32. In alternative embodiments, each of thermal dissipation structures 46 may include a plurality or a set of conductive thermal vias, such as circular or bar vias, extending between principal surfaces or sides 26, 50 of module substrate 32. As described in more detail below, exposed bottom surfaces 98 of thermal dissipation structures 46 (or the portion of patterned metal layer 74 overlying those surfaces 98) are physically and thermally coupled to a heatsink when STP electronic module 20 is integrated within a larger electrical system.

Example STP electronic module 20 further includes an RF signal input terminal; a power splitter 58; a two-stage, carrier amplifier 100; a two-stage peaking amplifier 102; various phase shift and impedance matching elements; a combining node 104; an output impedance matching network 106; and an RF signal output terminal. Through one or more conductive structures (e.g., vias, traces, and/or wirebonds, as shown), the RF signal input pad 76 is electrically coupled to an input 108 to the power splitter 58. Through one or more conductive structures (e.g., vias, traces, and/or wirebonds), the RF signal output pad is electrically coupled to combining node 104 (through network 106). Power splitter 58 is coupled to populated surface 50 of module substrate 32 and may include one or more discrete die and/or components. As noted above, power splitter 58 includes an input terminal 108 and two output terminals. Input terminal 108 is electrically coupled through one or more conductive structures (e.g., vias, traces, and/or wirebonds, as shown) to RF signal input pad 76 and to the RF signal input terminal, and thus is configured to receive an input RF signal. The output terminals of power splitter 58 are electrically coupled through one or more conductive structures (e.g., vias, traces, and/or wirebonds) and input circuits 110, 112 to inputs 114, 116 for the carrier and peaking amplifiers 100, 102, respectively. Power splitter 58 is configured to split the power of the input RF signal received through the RF input terminal into first and second RF signals, which are produced at the output terminals of power splitter 58. In addition, power splitter 58 may include one or more phase shift elements configured to impart about a 90 degree phase difference between the RF signals provided at the splitter output terminals. The first and second RF signals produced at the outputs of the power splitter 58 may have equal or unequal power, as described previously.

The first output of the power splitter is electrically coupled to a carrier amplifier path, and the second output of the power splitter is electrically coupled to a peaking amplifier path. The RF signal produced at the second power splitter output may be delayed by about 90 degrees from the RF signal produced at the first power splitter output. In other words, the RF signal provided to the peaking amplifier path may be delayed by about 90 degrees from the RF signal provided to the carrier amplifier path. In any event, the first RF signal produced by power splitter 58 is amplified through the carrier amplifier path, and the second RF signal produced by power splitter 58 is amplified through the peaking amplifier path. In the specific embodiment of FIG. 1, each of the carrier and peaking amplifier paths includes a two-stage power amplifier 100, 102, where a driver-stage transistor 90, 94 is implemented on a driver-stage die 34, 38, and a final-stage transistor 92, 96 is implemented on a separate final-stage die 36, 40. For example, each of transistors 90, 92, 94, 96 may be field effect transistors (FETs), such as laterally-diffused metal oxide semiconductor (LDMOS) FETs or high electron mobility transistors (HEMTs). The description and claims may refer to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

The carrier amplifier more specifically includes a silicon driver-stage die 34 and a gallium nitride (GaN) final-stage die 36; while the peaking amplifier also includes a silicon driver-stage die 38 and a GaN final-stage die 40, in accordance with an example embodiment In other embodiments, each of carrier and peaking amplifiers 100, 102 may include a two-stage power amplifier implemented on a single die, or each of the carrier and peaking amplifiers 100, 102 may include a single-stage power amplifier implemented on a single die. In still other embodiments, each of the carrier and peaking amplifiers may include a two-stage power amplifier implemented on separate driver and final-stage dies, but the driver and final-stage dies may be formed using the same semiconductor technology (e.g., both the driver and final-stage dies are silicon dies or GaN dies), or the driver and/or final-stage dies may be formed using different semiconductor technologies than those described above (e.g., the driver and/or final-stage dies may be formed from silicon germanium (SiGe) and/or gallium arsenide (GaAs) die).

The carrier amplifier path includes the above-mentioned driver stage die 34, the final-stage die 36, and a phase shift and impedance inversion element 118. Driver stage die 34 and final-stage die 36 of carrier amplifier path 100 may be electrically coupled together in a cascade arrangement between an input terminal 114 of driver stage die 34 (corresponding to a carrier amplifier input) and an output terminal 122 of final-stage die 36 (corresponding to a carrier amplifier output). Driver stage die 34 includes a plurality of integrated circuits. In embodiments, the integrated circuitry of die 34 includes a series-coupled arrangement of input terminal 114, an input impedance matching circuit (not numbered), a silicon power transistor 90, an integrated portion of an interstage impedance matching circuit (not numbered), and an output terminal not numbered. The gate of the transistor 90 is electrically coupled through the input impedance matching circuit to input terminal 114, while the drain of transistor 90 is electrically coupled through the output impedance matching circuit to the output terminal of die 34. The source of transistor 90 is electrically coupled to a patterned metal layer (or source terminal) on a bottom surface of die 34; and the bottom patterned metal layer is physically, electrically, and thermally coupled to the exposed top surface of a thermal dissipation structure 46. The output terminal of driver stage die 34 is electrically coupled to the input terminal of final-stage die 36 through a wirebond array or another type of electrical connection. Final-stage die 36 also includes a plurality of integrated circuits. In embodiments, the integrated circuitry of die 36 includes a series-coupled arrangement of an input terminal (not numbered), a GaN power transistor 92, and an output terminal 122. Specifically, the gate of transistor 92 is electrically coupled to the input terminal of die 36, and the drain of transistor 92 is electrically coupled to output terminal 122 of die 36. The source of transistor 92 is electrically coupled to a patterned metal layer on a bottom surface of die 36, and the bottom patterned metal layer is physically, electrically, and thermally coupled to the exposed top surface of a thermal dissipation structure 46.

The peaking amplifier path includes the above-mentioned driver stage die 38 and final-stage die 40. Driver stage die 38 and final-stage die 40 of the peaking amplifier path are electrically coupled together in a cascade arrangement between an input terminal 116 of driver stage die 38 (corresponding to a peaking amplifier input) and an output terminal 120 of final-stage die 40 (corresponding to a peaking amplifier output). Driver stage die 38 may include a plurality of ICs. In an embodiment, the integrated circuitry of die 38 includes a series-coupled arrangement of input terminal 116, an input impedance matching circuit (not numbered), a silicon power transistor 94, an integrated portion of an interstage impedance matching circuit (not numbered), and an output terminal not numbered, in an embodiment More specifically, the gate of transistor 94 is electrically coupled through the input impedance matching circuit to input terminal 116, and the drain of transistor 94 is electrically coupled through the output impedance matching circuit to the output terminal of die 38. The source of transistor 94 is electrically coupled to a patterned metal layer on a bottom surface of die 38, and the bottom patterned metal layer is physically, electrically, and thermally coupled to the exposed top surface of a thermal dissipation structure 46. The output terminal of driver stage die 38 is electrically coupled to the input terminal of final-stage die 40 through a wirebond array (not numbered) or another type of electrical connection. Final-stage die 40 also includes a plurality of integrated circuits. In an embodiment, the integrated circuitry of die 40 includes a series-coupled arrangement of an input terminal (not numbered), a GaN power transistor 96, and an output terminal 120. More specifically, the gate of transistor 96 is electrically coupled to the input terminal of die 40, and the drain of transistor 96 is electrically coupled to output terminal 120 of die 40. The source of transistor 96 is electrically coupled to a patterned metal layer on a bottom surface of die 40, and the bottom patterned metal layer is physically, electrically, and thermally coupled to the exposed top surface of a thermal dissipation structure.

As mentioned previously, for proper Doherty operation, the carrier amplifier may be biased to operate in a class AB mode, and the peaking amplifier may be biased to operate in a class C mode. To accomplish this biasing, a plurality of gate and drain bias voltages may be provided by external bias voltage sources. In embodiments, the bias voltages are provided through the bias terminals and interposer ring 42. Specifically, gate bias voltages for driver-stage transistors 90, 94 may be provided through driver gate bias terminals, drain bias voltages for driver-stage transistors 90, 94 may be provided through driver drain bias terminals, and gate bias voltages for final-stage transistors 92, 96 may be provided through gate bias terminals. Each of the terminals has a proximal end coupled to conductive structures (e.g., pads and traces) of patterned metal layer 68, and the conductive structures are electrically coupled (e.g., through wirebonds, as shown) to bias pads on the driver- and final-stage dies. In the illustrated embodiment, the gate and drain bias pads for both driver- and final-stage transistors 90, 92, 94, 96 are located on driver-stage dies 34, 38, and the gate bias voltage for final-stage dies 36, 40 "hops" from driver-stage dies 34, 38 to final-stage dies 36, 40 through wirebond connections, as shown. Returning again to the operation of amplifier electronic module 20, an amplified carrier signal is produced at output terminal 122 of final-stage die 36, and an amplified peaking signal is produced at output terminal 120 of final-stage die 40, which also functions as combining node 104 for the amplifier. According to an embodiment, output terminal 122 of carrier final-stage die 36 is electrically coupled (e.g., through wirebonds (not numbered) or another type of electrical connection) to a first end of the phase shift and impedance inversion element 118, and output terminal 120 of peaking final-stage die 40 is electrically coupled (e.g., through wirebonds (not numbered) or another type of electrical connection) to a second end of the phase shift and impedance inversion element 118.

According to an embodiment, phase shift and impedance inversion element 118 may be implemented with a quarter-wavelength or lambda/4 ($\lambda/4$) or shorter transmission line (e.g., a microstrip transmission line with an electrical length up to about 90 degrees) formed from a portion of patterned metal layer 68. As utilized herein, lambda denotes the wavelength of an RF signal at the fundamental frequency of operation of the amplifier (e.g., a frequency in a range of about 600 megahertz (MHz) to about 10 gigahertz (GHz) or higher). The combination of the phase shift and impedance inversion element 118 and the wirebond (or other) connections to output terminals 122, 120 of dies 36, 40 may impart about a 90 degree relative phase shift to the amplified carrier signal as the signal travels from output terminal 122 to output terminal 120/combining node 104. When the various phase shifts imparted separately on the carrier and peaking RF signals through the carrier and peaking paths, respectively, are substantially equal, the amplified carrier and peaking RF signals combine substantially in phase at output terminal 120/combining node 104. Output terminal 120/combining node 104 is electrically coupled (e.g., through wirebonds or another type of electrical connection) through an output impedance matching network 106 to the RF output terminal. As previously noted, various other SMDs may also be mounted to populated side 50 of module substrate 32 to complete the circuitry of STP electronic module 20, with an example of one such SMD 123 (e.g., a chip cap) shown in FIG. 1 as electrically coupled to output impedance matching network 106 along the length of its transmission line. In addition to performing over physical alterations to the circuitry of electronic module 20, when partially fabricated as a "sample" electronic module and utilized for tuning purposes, SMD 123 and other such SMDs (e.g., discrete capacitors, resistors, or inductors) can be repositioned, removed, and replaced with SMDs have differing values in the process of tuning a non-finalized (initial or intermediate) version of STP electronic module design to arrive at a final version of the design for production purposes. Such tuning is greatly facilitated through the usage of unique EVB stacks or module testing assemblies disclosed herein, with additional description in this regard provided below in connection with FIGS. 2-12.

Example Evaluation Board Assemblies for Tuning System Topside Cooled Power Amplifier Modules FIG. 5 is a simplified cross-sectional schematic of a module testing assembly 124 and a sample electronic module 126, which is removably installed within module testing assembly 124 for tuning purposes, as illustrated in accordance with an example embodiment of the present disclosure. Sample electronic module 126 is shown in an incomplete or intermediate state of manufacture and is fabricated in accordance with an LGA, STP architecture described above. Sample electronic module 126 may be considered analogous, or at least highly similar, to STP electronic module 20 shown in FIGS. 1-4 for purposes of the following description. However, in contrast to STP electronic module 20, which is shown in completed state in FIGS. 2-4, sample electronic module 126 is provided prior to encapsulation and prior to the attachment of any interposer piece or pieces to the module substrate; e.g., prior to attachment of a ring-shaped interposer piece corresponding to interposer piece 42 of electronic module 126 discussed above in connection with FIGS. 1 and 2. For clarity, sample electronic module 126 is illustrated in a simplified or generalized form in the cross-section of FIG. 5 as containing various generically-depicted circuit devices or components 128. It will be appreciated that components 128 include at least one power die (e.g., corresponding to power dies 34, 36, 38, 40 shown in FIG. 1 and including at least one RF power die bearing an amplifier IC) and also include any other circuit components contained in STP electronic module 20, such as non-die SMDs (e.g., corresponding to SMD 123 further shown in FIG. 1). Such circuit components are mounted to a populated side of a module substrate 130, which may assume the form of a multi-layer PCB and which generally corresponds to module substrate 32 of electronic module 20 (FIGS. 1 and 2). In a manner analogous to that described above in connection with module substrate 32, module substrate 130 is fabricated to include a metallized, non-populated surface 132, which may include one or more plated metal layers formed over the non-populated or thermal interface side of substrate 130 (corresponding to the outboard side of a completed STP electronic module, such as outboard side 30 of electronic module 20).

Among other structural components, module testing assembly 124 includes an electrically-routed substrate or EVB 134. EVB 134 may assume the form of a multi-layer PCB or other routed substrate, which emulates the system-level substrate (e.g., a motherboard) to which a finalized version of sample electronic module 126 is ultimately installed, as discussed below. EVB 134 includes a populated frontside 136, an opposing underside or backside 138, and an aperture or "EVB through-port" 140. EVB through-port 140 extends from frontside 136 to backside or underside 138 to penetrate EVB 134 in a thickness direction, which corresponds to the Y-axis of a coordinate legend 142 appearing in the lower left of FIG. 5. A number of electronic devices or components 144 (a few of which are labeled) populate frontside 136 of EVB 134 and may include any combination of power dies (including RF power dies bearing amplifier ICs as previously discussed), SMDs (e.g., discrete capacitors, resistors, or inductors), RF shield structures, and other such components commonly included in circuit board-based systems. Again, such circuit components may generally correspond to power dies 34, 36, 38, 40; SMD 123; and the other circuit components contained in STP electronic module 20 and previously described in detail above in connection with FIGS. 1-4. The circuit components contained in sample electronic module 126 are electrically interconnected by various traces or interconnect lines, wirebonds, and/or similar electrically-conductive features not shown (or only minimally shown) in FIG. 5.

FIG. 6 further depicts EVB frontside 136 prior to population of EVB 134, while FIG. 7 depicts EVB backside or underside 138 prior to attachment sample electronic module 126 and installation within module testing assembly 124. Referring collectively to FIGS. 5-7, EVB 134 further includes a module mount region 145, which is provided on EVB underside 138 in the present example and to which sample electronic module 126 is mounted (that is, mechanically joined and electrically interconnected) when installed within module testing assembly 124. As shown in FIG. 7, module mount region 145 extends around an outer periphery of EVB through-port 140 and may have a generally rectangular planform geometry, which dimensioned to be positioned adjacent an outer peripheral portion of the populate side of sample electronic module 126 in a face-to-face relationship when electronic module 126 is attached to EVB mount region 145 utilizing solder or another electrically-conductive bond material. Several EVB contacts 146 (here, "EVB contact pads 146") are distributed about module mount region 145 and electrically connected to column-like, vertical electrical connections 148 (referred to herein as "via ups" or "EVB vias 148"), which extend from EVB contact pads 146 to EVB contact pads 150 on frontside 136 of EVB 134. This may be appreciated by reference to detail bubble 152 shown in FIG. 5, which further depicts one instance of electronic module contact pads 154 included in sample electronic module 154, as well as solder bodies 156 (e.g., deposited and reflowed bodies of solder paste) utilized to electrically and mechanically join EVB contact pads 146 to electronic module contact pads 154 in the present example. In the context of a completed STP electronic module, electronic module contact pads 154 are typically bonded to one or more interposer pieces containing vertical electrical connections corresponding to EVB vias 148. Specifically, comparing sample electronic module 126 to STP electronic module 20, electronic module contact pads 154 correspond to the electronic module contact pads defined in patterned metal layer 68 (including electronic module contact pads 76, 78, 80, 82 identified in FIG. 2), which are ultimately bonded to the corresponding pads or contacts of interposer ring 42.

As shown most clearly in FIG. 6, EVB contact pads 150 may be exposed along frontside 136 of EVB 134 and electrically coupled to various traces or other electrically-conductive routing features 158. Such routing features 158 span frontside 136 to interconnect EVB contact pads 150 with RF I/O contact regions 160, 162 (located adjacent a first set of opposing edge regions of EVB 134) and pin terminal contact regions 164, 166 (also located adjacent a second set of opposing edge regions of EVB 134). Frontside EVB contact pads 150 surrounding EVB through-port 140 generally correspond to the contact pads of the system-level substrate to which a completed STP electronic module is mechanically mounted and electrically interconnected in the final application, noting that such a system-level substrate will typically lack EVB through-port 140, EVB vias 148, and backside EVB contact pads 146. Finally, a number of fastener openings 168 may be further provided through the corner regions of EVB 134, as shown in FIGS. 6 and 7. Fasteners, such as a threaded bolts, may be positioned through fastener openings 168 when module testing assembly 124 is assembled to secure the components of module testing assembly 124 in their desired positions, while exerting a predetermined clamp force thereon, as further discussed below in connection with FIG. 9. In other embodiments, a different approach may be employed for maintaining module testing assembly 124 is its assembled state, while permitting relatively easy disassembly of module testing assembly 124 when needed, with EVB 134 then lacking fastener openings 168.

EVB 134 may thus be described as including a first plurality of EVB contact pads 146, which are located on EVB underside 138 and which are arranged in one or more rows flanking EVB through-port 140; a second plurality of EVB contact pads 150, which are located on EVB frontside 136 and which are likewise arranged in one or more rows flanking EVB through-port 140; and a plurality of conductive vias 148 extending within EVB 134 (and specifically within the below-described EVB overhang region 181) to electrically couple EVB contact pads 146 with EVB contact pads 150. A number of vias-in-pads 146, 148, 150 are thereby provided to bring the electrical contacts with sample electronic module 126 established along module mount region 145 and EVB underside 138 to EVB frontside 136 for electrical routing purposes. As discussed below, EVB vias 148 effectively emulate the interposer vias of the interposer piece or pieces, which are mounted to a finalized version of an STP electronic module corresponding to sample electronic module 126; e.g., in the case of interposer ring 42, EVB vias 148 electrically mimic interposer vias 48 shown in FIGS. 1 and 2. Accordingly, EVB vias 148 (and also EVB contact pads 146, 150) are imparted with a spatial distribution substantially identical to a spatial distribution of the interposer vias (e.g., interposer vias 48 of interposer ring 42 shown in FIGS. 1 and 2) and the pads included in such an interposer piece or pieces (e.g., pads 24 of interposer ring 42 shown in FIGS. 1 and 2). In other words, the EVB vias 148 (and also EVB contact pads 146, 150) are aligned with the interposer vias. Moreover, in an embodiment in which the interposer piece has a first thickness ($T_1$) taken along an axis extending parallel to the interposer vias (e.g., thickness 60 of interposer ring 42 identified in FIG. 2), while EVB 134 has a second thickness ($T_2$) taken through module mount region 145 along an axis orthogonal to EVB sides 136, 138 (parallel to the Y-axis of coordinate legend 142), the thickness of EVB 134 may be similar, if not generally equivalent to that of the interposer piece or pieces such that the following equation applies: $0.5(T_2)<T_1<1.5(T_2)$.

In addition to EVB 134, module testing assembly 124 further includes an EVB baseplate 170 having a baseplate through-port 172, a pedestal heatsink 174 having a raised pedestal or "mesa" region 176, and a dielectric sheet or layer 178 positioned between EVB baseplate 170 and pedestal heatsink 174. EVB baseplate 170, which may have an average thickness greater than that of EVB 134 as taken in a thickness direction (corresponding to the Y-axis of coordinate legend 142), may be positioned below and support EVB 134 when module testing assembly 124 is fully assembled. In at least some embodiments, EVB baseplate 170 may be fabricated from an electrically-conductive material, such as Al or another metal. Dielectric layer 178 is captured between a lower surface of EVB baseplate 170 and an upper surface of pedestal heatsink 174, which will also typically be fabricated from an electrically-conductive material (e.g., Cu) or combination of materials having a relatively high thermal conductivity. Dielectric layer 178, which assume the form of a relatively thin (e.g., 10-50 millimeter thick) polymeric sheet including a cutout (aperture 186) to accommodate the passage of raised mesa region 176 included in pedestal heatsink 174, as described below. Dielectric layer 178 is thus positioned between EVB baseplate 170 and pedestal heatsink 174 to provide electrical insulation between these components, along with a peripheral air gap 180 surrounding an outer periphery of mesa region 176 and sample electronic module 126.

As just stated, a peripheral air gap 180 is created within module testing assembly 124 when sample electronic module 126 (or another sample electronic module) is installed therein. Peripheral air gap 180 surrounds (and is therefore bound along its interior perimeter) by the sidewalls of sample electronic module 126 and the sidewalls of raised mesa region 176 of pedestal heatsink 174, which projects into baseplate through-port 172 as shown. Peripheral air gap 180 is further bound along its outer perimeter by the interior walls of EVB base plate 170, along its upper surface by an encroaching or overhang region 181 of EVB 134 (identified in FIG. 7 and described below), and along its lower surface by dielectric layer 178 or perhaps by pedestal heatsink 174. In embodiments in which EVB baseplate 170 and pedestal heatsink 174 are each fabricated from one or more electrically-conductive materials, dielectric layer 178 and peripheral air gap 180 cooperate to provide electrical isolation between these structures. Additionally, peripheral air gap 180 provides direct electrical isolation between sample electronic module 126 and the interior walls of EVB baseplate 170 defining EVB through-port 172. In other embodiments, a different configuration can be utilized to provide electrical isolation between EVB baseplate 170 and pedestal heatsink 174 as required, such as a fixture or shims maintaining a vertical air gap between these components.

Figure 8:
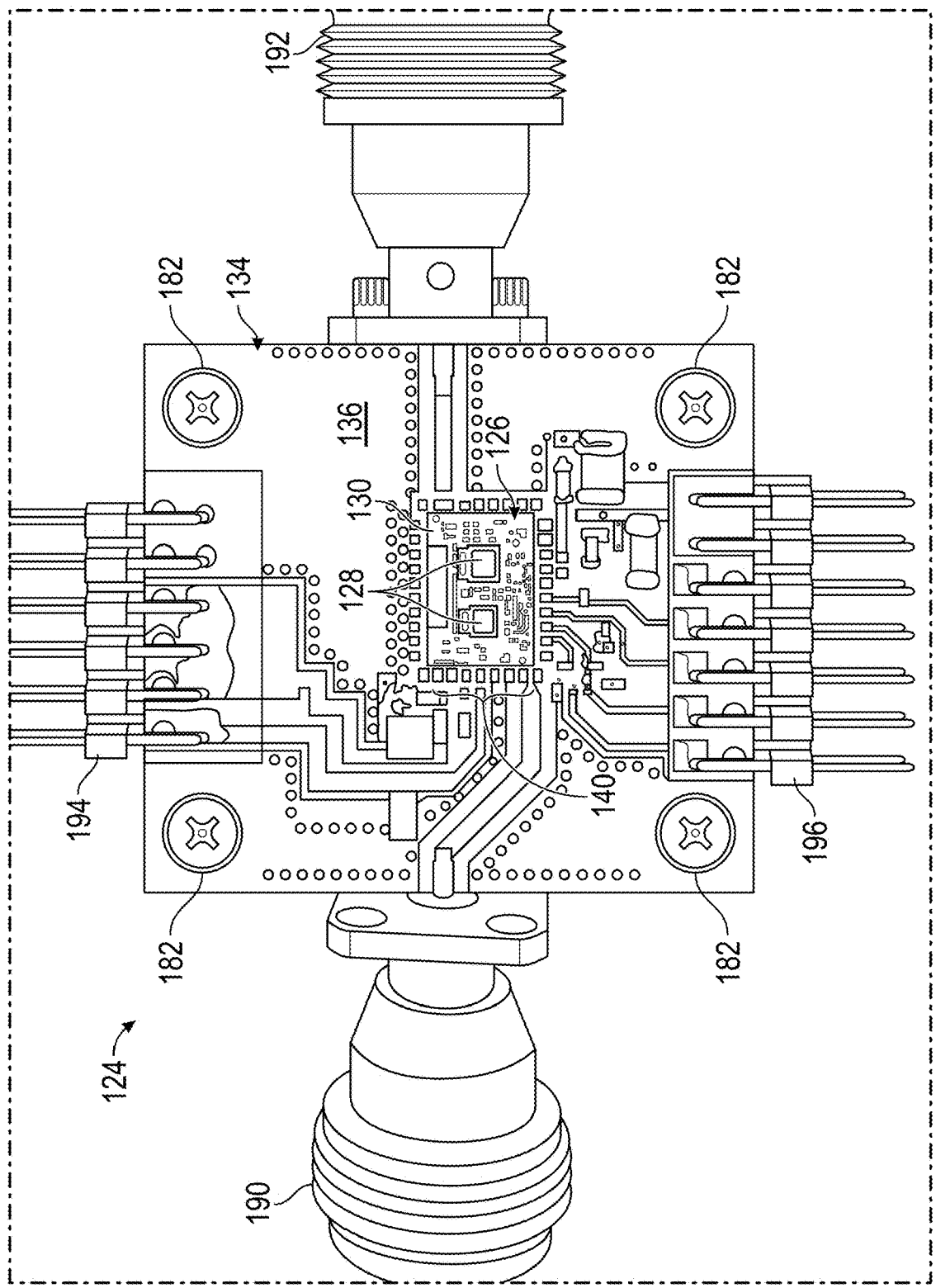
FIG. 8 is top planform view of the example module testing assembly and sample electronic module shown in FIGS. 5-7, which further depicts RF connectors and multipin connectors suitably attached to the EVB included in embodiments of the module testing assembly.
Figure 9:
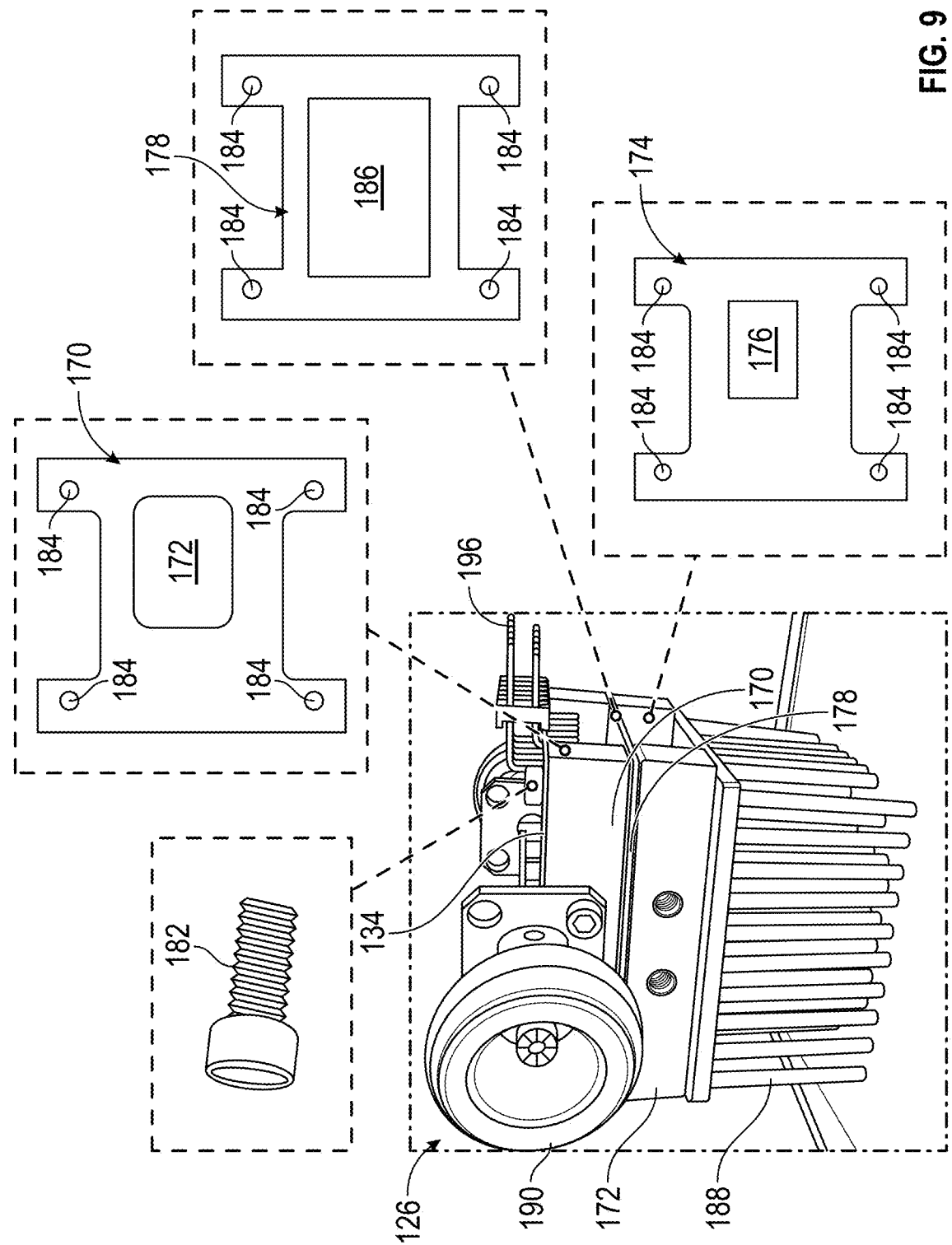
FIG. 9 is a schematic presenting multiple views of various components suitably included in embodiments of the module testing assembly shown in FIGS. 5-8.

Referring now to FIGS. 8 and 9 in conjunction with FIGS. 5-7, module testing assembly 124 may include some form of retention mechanism or fastener system facilitating manual assembly and disassembly of module testing assembly 124, while physically securing the components of module testing assembly 124 in their desired positions (e.g., through the application of substantially uniform clamp force) following assembly of module testing assembly 124. In the illustrated example, several threaded fasteners 182 (visible in FIG. 8 and FIG. 9) and associated hardware (e.g., nuts and washers) are utilized for this purpose and potentially composed of a dielectric material (e.g., a polymer) to prevent undesired electrical bridging. Fasteners 182 are received through openings 168 provided in EVB 134 (FIGS. 6-7), as well as through aligning openings 184 provided through the corner regions of EVB baseplate 170, dielectric layer 178, and pedestal heatsink 174 (shown in FIG. 9). As can further be seen in FIG. 9, a central opening or aperture 186 is provided through dielectric layer 178 to enable mesa region 176 of pedestal heatsink 174 to project upwardly through dielectric layer 178 and into baseplate through-port 172 to support sample electronic module 126. In this regard, sample electronic module 126 may be mechanically and thermally coupled to mesa region 176 of pedestal heatsink 174 to simulate the system-level chassis or heatsink to which a finalized version of electronic module 126 (that is, an electronic module produced in accordance with the finished STP electronic module design) is ultimately mounted. As described further below, metallized surface 132 may be soldered to or otherwise joined to the upper planar surface of mesa region 176 utilizing a thermally-conductive bonding material. Lastly, as shown in the bottom left of FIG. 9, a pin-fin array 188 or a similar thermally-conductive, high surface area structure may be integrally formed with or joined to pedestal heatsink 174 opposite mesa region 176 in certain implementations.

As more clearly shown in FIG. 8, RF I/O connectors 190, 192 are further installed on (electrically and mechanically connected to) EVB 134 and, specifically, to RF I/O contact regions 160, 162 identified in FIGS. 6 and 7. Similarly, multi-pin terminals or "pin-outs" 194, 196 may also be installed on pin terminal contact regions 164, 166 (identified in FIG. 6) in embodiments. During tuning of sample electronic module 126, an RF input signal is applied to one of RF I/O connectors 190, 192 and ultimately supplied to the RF input of sample electronic module 126 via the appropriate traces and electrical components of EVB 134. Sample electronic module 126 provides the desired RF power or signal amplification function generating an amplified RF output signal, which is then supplied to the other of RF I/O connectors 190, 192 again through the appropriate traces and electrical components of EVB 134. Concurrently, electrical signals for conveying bias voltages, ground reference voltages, or power may applied be to electronic module 126 through pin-outs 194, 196. The RF output signal generated by sample electronic module 126 and EVB 134 is measured and then utilized to evaluate performance characteristics of sample electronic module 126, with adjustments or modifications made to electronic module circuitry to fine tune the measured characteristics.

Notably, ready physical access is provided to circuit components 128 on the populated side of sample electronic module 126 from topside surface or frontside 136 of EVB 134 and through EVB through-port 140. In addition to the provision of EVB through-port 140 itself, such physical access is enabled the unique manner in which sample electronic module 126 is mounted in an inverted or mirrored orientation to module mount region 145 of EVB 134, with EVB vias 148 then carrying the appropriate electrical connections to the populated side of EVB 134 (EVB frontside 136) for signal and power routing mimicking the final system-level substrate layout Concurrently, baseplate through-port 172 is dimensioned to allow insertion or nesting of sample electronic module 126 within through-port 172, with the overhanging geometry (created due to the disparity in planform dimensions between EVB through-port 140 and baseplate through-port 172) further enabling electrical and physical contact to be established between contact pads 154 of sample electronic module 126 (e.g., corresponding to the electronic module contact pads joined to the interposer piece(s) in a finalized version of the electronic module) to EVB contact pads 146 distributed around module mount region 145. Not only does such a unique structural arrangement provide ready access to the circuitry of sample electronic module 126 for tuning purposes, but a highly realistic representation or emulation of the final application is created. This is due, in part, to the manner in which EVB mount region 145 and overhang region 181 of EVB 134 mimics the interposer piece or pieces (or other structure by which the vertical electrical connections interconnecting module substrate 130 to I/O terminals of the finalized electronic module) from structural and electrical perspectives, as well as the manner in which heat dissipation or extraction from sample electronic module 126 can be tailored through appropriate dimensioning and design (e.g., composition) of pedestal heatsink 174 to closely match thermal performance aspects of the system-level heatsink provided in the final application. In this latter regard, it should also be noted that EVB through-port 140 also conveniently provides LOS access or an inspection window for thermal analysis of the populated side of sample electronic module 126 utilizing, for example, one or more infrared cameras 198 (one of which is generally shown in FIG. 5) or similar image analysis tools.

To enable installation of sample electronic module 126 within module testing assembly 124, baseplate through-port 172 is imparted with planform dimensions (e.g., a length and width) greater than those of EVB through-port 140, as previously noted. Sample electronic module 126 is further received into baseplate through-port 172 when mounted to underside 138 of EVB 134. Such a structural arrangement creates an encroaching, overhang region 181 of EVB 134. EVB overhang region 181 extends over EVB through-port 172 to partially cover EVB through-port 172, as seen from the populated frontside 136 of EVB 134. Sample electronic module 126 is mounted to EVB 134 in a manner covering EVB through-port 140, as viewed from underside 138 of EVB 134, with the EVB through-port 140 providing physical access to the non-encapsulated circuitry of sample electronic module 126 via EVB through-port 140 from EVB frontside 136. Additionally, in an embodiment in which sample electronic module 126 is mounted to a first EVB side (here, EVB underside 138), module mount region 145 encroaches over baseplate through-port 172 such that baseplate through-port 172 is partially covered by EVB 134 when viewed from a second EVB side (here, from EVB frontside 136).

After each testing iteration, one or more characteristics of sample electronic module 126 may be adjusted for trial-and-error tuning purposes by accessing electronic module circuit components 128 from EVB frontside 136 through EVB through-port 140. Specifically, adjustments can be made in SMD characteristics (e.g., by shifting SMD positioning, by interchanging SMDs having varying values, or by physically interacting with adjustable components), in wirebond configurations (e.g., by adding, removing, or repositioning wirebonds), and in other physical features of the electronic module circuitry. Thermal analysis may also be conducted to ensure that excessively high local temperatures or "hot spots" are reduced or eliminated across the electronic module circuit architecture. Referring again to FIG. 1 as an analogy, the depicted wirebonds can be removed (e.g., physically plucked by a technician) and replaced with new wirebonds having varying lengths, loop heights, or array spacings to vary electrical characteristics (e.g., induction and resistance values) of the electronic module circuitry. SMD electrical characteristics may also be adjusted by, for example, turning a small screw or otherwise interacting with an SDM to fine-tune certain electrical values of the SMD in the case of, for example, tunable capacitors, tunable inductors, and tunable resistors. Other types of circuit components, such as discrete fuses, may also be replaced or adjusted in a similar manner. So too can the thermal characteristic of the electronic module circuitry be changed through variations in wirebonding by, for example, introducing additional wirebonds to better distribute thermal gradients and reduce local hot spots. SMDs, such as SMD 123 shown in FIG. 1, can be repositioned or substituted (e.g., by softening existing solder bonds through local heat application) for other SMDs having varying values; e.g., by a technician utilizing soldering tools and specialized tweezers to manually manipulate different components. In this manner, sample electronic module 126 may be readily tuned based upon the measured RF output signal and/or thermal analysis results, while sample electronic module 126 remains attached to underside 138 (generically, a "first EVB surface"). Additional description of example manners in which this tuning process may be performed, and an example manner by which module testing assembly 124 may be assembled to contain sample electronic module 126 for tuning purposes, will now be discussed in conjunction with FIG. 10.

Example Method for Tuning a Sample Electronic Module Utilizing an EVB Stack

Figure 10:
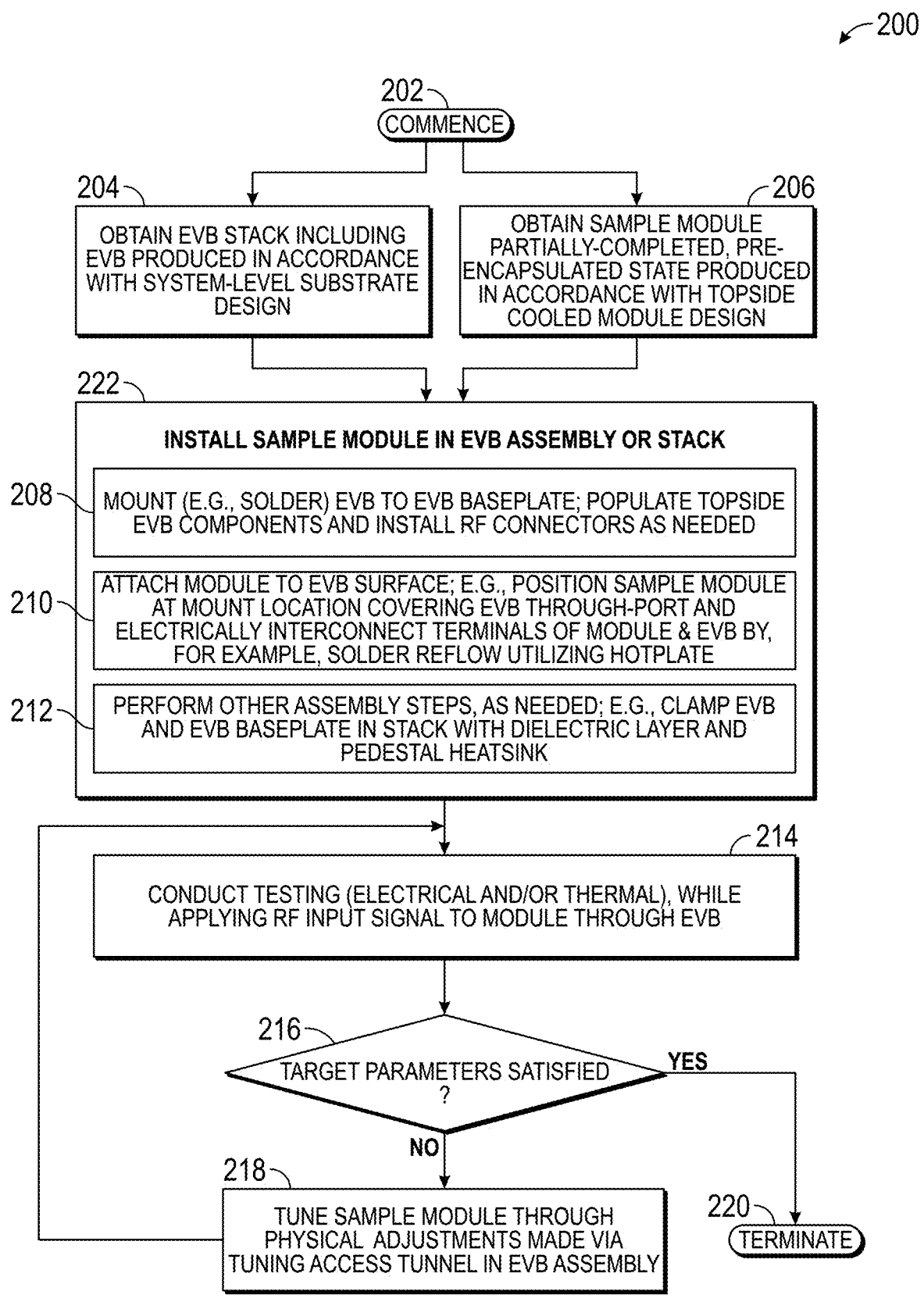
FIG. 10 is a flowchart setting-forth a method for tuning an electronic module design utilizing a sample electronic module and a module testing assembly, such as the sample electronic module and module testing assembly shown in FIGS. 5-9, as illustrated in accordance with an example embodiment of the present disclosure.

Turning now to FIG. 10, an STP electronic module tuning method 200 is presented in accordance with an example embodiment of the present disclosure. For purposes of explanation, STP electronic module tuning method 200 is described as carried-out utilizing sample electronic module 126 (FIGS. 5, 8, and 9) and module testing assembly 124 (FIGS. 5-9). It will be appreciated, however, that alternative embodiments of STP electronic module tuning method 200 can be carried-out utilizing other sample electronic modules and module testing assemblies, which may materially differ relative to sample electronic module 126 and module testing assembly 124 in various respects. STP electronic module tuning method 200 includes a number of process STEPS 202, 204, 206, 208, 210, 212, 214, 216, 218, 220, each of which is described, in turn, below. STEPS 208, 210, 212 are further encompassed as part of a SUBPROCESS 222 in the illustrated example. Depending upon the particular manner in which STP electronic module tuning method 200 is implemented, each step generically illustrated in FIG. 10 may entail a single process or multiple sub-processes. Further, the steps illustrated in FIG. 10 and described below are provided by way of non-limiting example only. In alternative embodiments of STP electronic module tuning method 200, additional process steps may be performed, certain steps may be omitted, and/or the illustrated process steps may be performed in alternative sequences.

After commencing (STEP 202), STP electronic module tuning method 200 involves two initial steps or processes, STEPS 204, 206, which may be performed in succession or concurrently. STEP 204 involves obtaining a module testing assembly, which includes an EVB fabricated in accordance with the system-level substrate design. Stated differently, the EVB possesses unique features (including an EVB through-port) lacking in the system-level substrate as described herein, but otherwise mimics the system-level substrate design to the extent possible. Often, in this regard, the EVB design will be a derivative of the system-level substrate design, which is modified to create a cut-out forming the EVB through-port and (when a mirrored mounting scheme is employed) which is further appended to include backside contact pads and via ups bringing the appropriate the electrical connections to frontside contact pads to which a finalized electronic module will ultimately be mounted in the end application. As appearing herein, the term "obtain" encompasses any method of obtaining a named assembly or component, such as a module testing assembly or a sample electronic module, whether by purchasing (or otherwise obtaining) the named assembly or component from a supplier or by independent fabrication of the named assembly or component In this regard, and as previously noted, it may be the case that a first entity (or multiple entities) produces some or all of the components included the module testing assembly in embodiments, while a different entity (or multiple entities) perform other steps included in STP electronic module tuning method 200. Similarly, so too is a sample electronic module obtained during STEP 206 of STP electronic module tuning method 200, with the sample electronic module obtained in a partially-completed state fabricated in accordance with an STP electronic module design; e.g., as previously discussed, the sample electronic module may be furnished prior to encapsulation and prior to interposer piece attachment, but otherwise fabricated utilizing the process flow and specifications established for fabricating production-level STP electronic modules.

Next, at SUBPROCESS 222, the sample electronic module is installed in the module testing assembly. As indicated in FIG. 10, this subprocess may entail initially mounting the EVB to the EVB baseplate (STEP 208). For example, and referring to again to FIGS. 5-9, underside 138 of EVB 134 may be attached to the frontside of EVB baseplate 170 by soldering or, perhaps, utilizing another electrically-conductive bonding material. Also during STEP 208, frontside 136 of EVB 134 may be populated following mounting of EVB 134 to EVB baseplate 170, which effectively reinforces EVB 134 for handling. Standard processes for placing (e.g., utilizing a pick-and-place tool or using a manual process) components, soldering or otherwise bonding components in placed, and forming other electrical connections (e.g., via wirebonding) may be carried-out as appropriate to populate frontside 136 of EVB 134, as generically shown in FIG. 5. So too may the RF connectors (e.g., RF I/O connectors 190, 192 shown in FIG. 8) and any additional I/O connectors (e.g., pin-outs 194, 196 further shown in FIG. 8) may also be installed at this juncture of STP electronic module tuning method 200 in embodiments.

Advancing to STEP 210 of method 200, the sample electronic module is next attached to the EVB surface. An example of one manner in which the sample electronic module mount process may be carried-out is illustrated in FIG. 11. In this case, sample electronic module 126 may be mounted to EVB backside 138 and, specifically, to module mount region 145 by solder reflow to attach sample electronic module 126 to EVB 134, while providing the desired electrical interconnections between electronic module contact pads 154 and EVB contact pads 146. When so mounted, sample electronic module 126 covers EVB through-port 140 as seen from the bottomside of EVB 134. In one approach, as shown in FIG. 11, solder bodies 156' (the prime symbol denoting that solder joints 156 have not yet been reflowed) may be deposited as, for example, low temperature solder paste on electronic module contact pads 154, EVB contact pads 146, or both. Next, and as indicated by arrow 223 in FIG. 11, sample electronic module 126 may then be placed in its desired position, with an outer peripheral region of the circuit-bearing surface of APM module substrate 130 seating on module mount region 145. Solder reflow may then be carried-out by, for example, placing a hotplate 226 in contact with metallized outboard surface 132 of sample electronic module 126 (as indicated by arrow 224 in FIG. 11) and then energizing hotplate 226 to deliver the desired heat load to solder bodies 156' through the body of sample electronic module 126, as further indicated in FIG. 11 by symbol 228.

Returning again to FIG. 10, additional assembly steps are performed to complete assembly of module testing assembly 126, as appropriate (STEP 212). In the illustrated example, this includes positioning dielectric layer 178 onto pedestal heatsink 174, and placing dielectric layer 178 and pedestal heatsink 174 in their desired spatial relationship relative to EVB 134, EVB baseplate 170, and sample electronic module 126 (now bonded to underside 138 of EVB 134). Pedestal heatsink 174, in particular, is positioned such that mesa region 176 extends upwardly into EVB through-port 172 (and through the aligning opening provided in dielectric layer 178) to contact or otherwise be placed in thermal communication with metallized surface 132 of sample electronic module 126. In one approach, to better simulate an assembly-level heatsink present in the final application, metallized surface 132 of sample electronic module 126 may be soldered to mesa region 176 or otherwise joined to mesa region 176 utilizing a bonding material (e.g., a metal-containing epoxy or a sinter material) having a relatively high thermal conductivity. In other embodiments, this may not be the case. Further, at some juncture following full assembly of module testing assembly 124, a clamp force may be exerted through module testing assembly 124; e.g., as noted above, threaded fasteners 168, 182 may be passed through openings 184, with nuts installed on the exposed ends of fasteners 168, 182 and then tightened to apply a predetermined, substantially uniform clamping force through the module testing assembly 124.

Next, at STEP 214 of method 200, a testing iteration is carried-out. During this step, an RF input signal is applied to sample electronic module 126 while installed on the EVB, and an RF output signal generated by the sample electronic module is measured. From these electrical measurements, various key characteristics pertaining to the sample electronic module can be assessed. Additionally, thermal measurements may be taken. Next, at STEP 216, such electrical measurements are compared to target ranges for these characteristics; e.g., target ranges specifying power levels, gain, efficiency, linearization, and operational frequency ranges desirably achieved when arriving at the finalized version of the electronic module design. If the target parameters are satisfied, method 200 progresses STEP 220; and STP electronic module tuning method 200 terminates. Otherwise, tuning adjustments are conducted at STEP 218 before returning to STEP 214 and conducting further testing. As noted above, characteristics of the sample electronic module (e.g., an STP PAM) may then be tuned based, at least in part, on the measured RF output signal. To accomplish such tuning, a technician accessing the circuit components through the EVB through-port to physically interact with the various circuit components of the sample electronic module in the manner previously discussed, while the sample electronic module remains attached to the first EVB surface to tune the sample electronic module. Again, such tuning adjustments may involve the removal, replacement, or repositioning of circuit components, such as SDMs and wirebonds), as well as manual adjustments made to tunable components (e.g., tunable resistors, capacitors, or inductors) to fine-tune the electrical characteristics or values of such components.

Additional Examples of the EVB Assembly

FIG. 12 is a simplified cross-sectional schematic of a module testing assembly 230 and a sample electronic module 232, as illustrated in accordance with a further example embodiment of the present disclosure. As was previously the case, module testing assembly 230 includes a EVB 246 to which sample electronic module 232 is bonded when installed within module testing assembly 230 for tuning purposes. As generically shown, sample electronic module 232 is furnished in a partially-completed, pre-encapsulated state and includes a module substrate 234, such as a multilayer PCB. Module substrate 234 has an inboard metallized surface 236 and an opposing, populated mount surface to which a number of microelectronic components 238, including one or more RF power semiconductor dies, are mounted. In certain cases, electronic module 232 may further be fabricated to include one or more interposer pieces, such as an interposer ring 240, bonded to non-illustrated electronic module contact pads present on the populated side of module substrate 234, as discussed at length above. In this case, the contacts or contact pads exposed along the edge region of interposer ring 240 furthest module substrate 234 may be electrically and mechanically joined to corresponding EVB contact pads included in a module mount region 242 provided on the populated frontside of module substrate 234 in a manner akin to that previously described. In other instances, sample electronic module 232 may lack such an interposer piece and the electronic module contact pads exposed along an outer peripheral portion of the populated side of electronic module substrate 234 may be bonded to the corresponding contact pads provided on module substrate 234; or, perhaps, EVB 246 may be produced to include a mock interposer piece to which sample electronic module 232 is bonded.

Now discussing EVB 246 in greater detail, EVB 246 includes a frontside 248 populated by components 250; a backside 252 opposite frontside 248; and EVB through-port 254 extending from frontside 248 to backside 252. As should be gathered from the foregoing description, EVB 246 emulates the design of a motherboard or other system-level substrate to which a completed version of sample electronic module 242 (when produced in accordance with the finalized STP electronic module design) is ultimately mounted. Although not shown in the simplified cross-section of FIG. 12, EVB 246 may also be outfitted with RF connectors and, perhaps, additional connectors (e.g., pin-outs) similar connectors 190, 192 and pin-outs 194, 196 shown in FIG. 8. Once again, EVB 246 is supported by an EVB baseplate 256 having a baseplate through-port 258 formed therethrough. Specifically, baseplate through-port 258 extends from the frontside of EVB baseplate 256, which may contact EVB backside 252 to support EVB 246, to the backside of EVB baseplate 256. Further, as taken along the Z-axis of a coordinate legend 260 shown the bottom left of FIG. 12, EVB through-port 258 at least partially overlaps with, and may be substantially co-axial with, EVB throughput 246 to define a tuning access tunnel 254, 258 providing physical access to circuit components 238 of sample electronic module 242, as further discussed below. module testing assembly 230 may further include additional components, such as a system-level heatsink 262, which is thermally coupled to (e.g., placed in thermal contact with) inboard metallized surface 236 of sample electronic module 232 when installed within module testing assembly 230 to simulate the system-level heatsink, such as a metal chassis or pin-fin array. In the illustrated example, system-level heatsink 262 assumes the form of a relatively small pin-fin array, but can assume various other dimensions and geometries in actual implementations as chosen to, for example, most accurately represent the heat dissipation capabilities of the heatsink included in the final application. Lastly, as indicated in FIG. 12, an electrically-conductive cover piece 264 can be temporarily positioned over EVB through-port 254 and electrically coupled to EVB 246 in at least some instances to, for example, simulate the PCB ground plane during electrical testing, with cover piece 264 readily removed to provide access to circuit components 238 of sample electronic module 242 when needed.

Thus, as does module testing assembly 124 described above in connection with FIGS. 5-11, module testing assembly 230 includes (i) an EVB having EVB through-port and a module mount region provided on a first side of EVB 246, and (ii) an EVB baseplate supporting the EVB and having a baseplate through-port. Further, the baseplate through-port combines with the EVB through-port to form a tuning access tunnel providing physical access to circuit components of the sample electronic module through the EVB baseplate and from a second side of the EVB when the sample electronic module is installed on the module mount region. However, in this example, sample electronic module 232 is not mounted to backside 252 of EVB 246 in a mirrored orientation and position (relative to the orientation and position of a completed electronic module in the final application), but is rather mounted to frontside 248 of module testing assembly 2430 in a non-mirrored orientation and position largely, if not precisely co-incident with the orientation and position of a completed electronic module in the final application. Accordingly, physical access is provided to circuit components 238 on the populated side of sample electronic module 232 from backside 252 of EVB 246 and through EVB through-port 140. While this is a somewhat different tuning apparatus approach relative to the mirrored approach discussed above in connection with FIGS. 5-11, many of the same advantages are achieved. For example, once again access to the circuitry of sample electronic module 232 is provided to facilitate tuning through physical manipulation and alteration of the circuit components contained in sample electronic module 232, as well as allowing visual access for thermal analysis. Additionally, a highly realistic representation or emulation of the final application is created.

CONCLUSION

There has thus been disclosed methods and module testing assemblies for tuning electronic modules; e.g., STP electronic modules, such as STP electronic module designs having surface mount (e.g., flat no-lead or grid array) formfactors. Embodiments of the module testing assembly include unique structural features that, in combination with provision of a sample electronic module in a partially-fabricated, pre-encapsulated form, allow ready physical and visual access to the electronic module circuitry for tuning purposes; e.g., including the collection of thermal and/or electrical testing data and physical and/or the electrical modification of circuit components contained in the sample electronic module. A highly realistic representation or emulation of the final application is created due to, for example, the inclusion of features emulating a system-level heatsink (e.g., a pedestal heatsink when a mirrored electronic module mounting approach is employed) and/or features emulating any interposer piece or pieces contained in the finalized STP electronic module design (e.g., vertical electrical connections or "via ups" through an EVB overhang region when a mirrored electronic module mounting approach is employed). Generally, then, the presently-disclosed method and EVB assemblies enable increasingly efficient and effective tuning processes to be carried-out when finalizing STP electronic module designs for production-level electronic modules deployed into customer applications.

Embodiments of a module testing assembly utilized in tuning an STP electronic module design or model have been provided. In at least some embodiments, the module testing assembly includes an EVB and an EVB baseplate, which supports the EVB and which has a baseplate through-port therethrough. The EVB includes, in turn, a first EVB side, a second EVB side opposite the first EVB side, an EVB through-port extending from the first EVB side to the second EVB side, and a module mount region on the first EVB side and extending about a periphery of the EVB through-port. The module mount region shaped and sized to accommodate installation of a sample electronic module provided in a partially-completed, pre-encapsulated state and fabricated in accordance with the separate thermal path electronic module design. The baseplate through-port combines with the EVB through-port to form a tuning access tunnel providing physical access to circuit components of the sample electronic module through the EVB baseplate from the second EVB side when the sample electronic module is installed on the module mount region. Further, in at least some embodiments, the EVB further includes a first plurality of EVB contact pads distributed about the module mount region and positioned to contact electronic module contact pads of the sample electronic module when installed on the module mount region. In such embodiments, the first plurality of EVB contact pads may be arranged in one or more rows flanking the EVB through-port Additionally or alternatively, the STP electronic module design may include an interposer piece in which interposer vias are embedded; the sample electronic module may be provided at a manufacturing stage prior to attachment of the interposer piece; and the first plurality of EVB contact pads may have a spatial distribution substantially identical to a spatial distribution of the interposer vias. In other words, the EVB contact pads are aligned with the interposer vias. Finally, in at least some instances, the EVB my further include a second plurality of EVB contact pads located on second EVB side, as well as conductive vias extending within the EVB to electrically couple the first plurality of EVB contact pads with the second plurality of EVB contact pads.

Methods performed in conjunction with tuning an STP electronic module have also been provided. In embodiment, the method includes the steps of processes of: (i) producing, purchasing, or otherwise obtaining an EVB having a first EVB side, a second EVB side opposite the first EVB side, an EVB through-port extending from the first EVB side to the second EVB side, a module mount region on the first EVB side and extending around a periphery of the EVB through-port, and EVB contact pads spaced about the module mount region; (ii) further producing, purchasing, or otherwise obtaining a sample electronic module in a partially-completed, pre-encapsulated state manufactured in accordance with the separate thermal path electronic module design, the sample electronic module containing a module substrate, circuit components populating a first side of the module substrate, and electronic module contact pads on the first side of the module substrate and electrically coupled to the circuit components; and (iii) attaching the sample electronic module to the first EVB side at a location covering the EVB through-port such that the electronic module contact pads are electrically coupled to the EVB contact pads. When the sample electronic module is so attached, the EVB through-port provide physical access to the circuit components from the second EVB side to enable tuning of the sample electronic module when supplied with an RF input signal while installed on the EVB.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A module testing assembly, comprising:
    an evaluation board (EVB), comprising:

a first EVB side;
a second EVB side opposite the first EVB side;
an EVB through-port extending from the first EVB side to the second EVB side; and
a module mount region on the first EVB side and extending about a periphery of the EVB through-port, the module mount region shaped and sized to accommodate installation of a sample electronic module;
a sample electronic module mounted to the EVB; and
an EVB baseplate supporting the EVB and having a baseplate through-port, the baseplate through-port combining with the EVB through-port to form a tuning access tunnel providing physical access to circuit components on a first side of the sample electronic module through the EVB baseplate from the second EVB side.

2. The module testing assembly of claim 1 wherein the EVB further comprises a first plurality of EVB contact pads distributed around the module mount region and positioned to contact electronic module contact pads of the sample electronic module when the sample electronic module is installed on the module mount region.

3. The module testing assembly of claim 2, wherein the first plurality of EVB contact pads is arranged in one or more rows flanking the EVB through-port.

4. The module testing assembly of claim 2, wherein the sample electronic module comprises electronic module contact pads to which the first plurality of EVB contact pads is electronically interconnected.

5. The module testing assembly of claim 4, wherein the EVB further comprises:
a second plurality of EVB contact pads located on the second EVB side; and
vias extending within the EVB to electrically couple the first plurality of EVB contact pads with the second plurality of EVB contact pads.

6. The module testing assembly of claim 1, wherein the first EVB side comprises a populated frontside of the EVB, while the second EVB side comprises a non-populated underside of the EVB located opposing the populated frontside of the EVB and adjacent the EVB baseplate.

7. The module testing assembly of claim 6, wherein the module mount region encroaches over the baseplate through-port such that the baseplate through-port is partially covered by the EVB when viewed from the second EVB side.

8. The module testing assembly of claim 1, wherein the first EVB side comprises an underside of the EVB; and
wherein the baseplate through-port is dimensioned to receive the sample electronic module therein when the sample electronic module is joined to the module mount region provided on the underside of the EVB.

9. The module testing assembly of claim 8, further comprising a pedestal heatsink configured to support the EVB baseplate, the pedestal heatsink having a raised mesa region dimensioned to extend into the baseplate through-port and contact a non-populated side of the sample electronic module.

10. The module testing assembly of claim 9, further comprising:
a dielectric layer between the EVB baseplate and the pedestal heatsink; and
a peripheral air gap between the raised mesa region and inner walls of the EVB baseplate defining the baseplate through-hole, the peripheral air gap and the dielectric layer cooperating to electrically isolate the pedestal heatsink from the EVB baseplate when the module testing assembly is assembled.

11. The module testing assembly of claim 1, wherein the second EVB side comprises a populated frontside of the EVB, while the first EVB side comprises a non-populated underside of the EVB located opposing the populated frontside of the EVB and adjacent the EVB baseplate.

12. The module testing assembly of claim 11, wherein the tuning access tunnel provides access to the sample electronic module through the EVB through-port and through the baseplate through-port.

13. A module testing assembly, comprising:
an evaluation board (EVB), comprising:
a first EVB side;
a second EVB side opposite the first EVB side;
an EVB through-port extending from the first EVB side to the second EVB side; and
a module mount region on the first EVB side and extending about a periphery of the EVB through-port, the module mount region shaped and sized to accommodate installation of a sample electronic module;
a sample electronic module mounted to the EVB; and
an EVB baseplate supporting the EVB and having a baseplate through-port, the baseplate through-port combining with the EVB through-port to form a tuning tunnel providing physical access to circuit components of the sample electronic module through the EVB baseplate from the second EVB side;
wherein the circuit components of the sample electronic module comprise a radio frequency (RF) power die; and
wherein the EVB through-port is dimensioned and positioned to provide access to the RF power die when the sample electronic module is joined to the EVB.

14. A method performed in conjunction with tuning an electronic module, the method comprising:
obtaining an evaluation board (EVB) having a first EVB side, a second EVB side opposite the first EVB side, an EVB through-port extending from the first EVB side to the second EVB side, a module mount region on the first EVB side and extending around a periphery of the EVB through-port, and EVB contact pads distributed about a periphery of the module mount region;
further obtaining a sample electronic module containing a module substrate, circuit components populating a first side of the module substrate, and electronic module contact pads on the first side of the module substrate and electrically coupled to the circuit components; and
attaching the sample electronic module to the first EVB side at a location covering the EVB through-port such that the electronic module contact pads are electrically coupled to the EVB contact pads, the EVB through-port providing physical access to the circuit components on the first side of the module substrate from the second EVB side.

15. The method of claim 14, further comprising:
measuring an RF output signal from the sample electronic module when supplied with a radio frequency (RF) input signal while installed on the EVB; and
adjusting one or more characteristics of the sample electronic module by accessing the circuit components through the EVB through-port, while the sample electronic module remains attached to the first EVB side to tune the sample electronic module based upon the measured RF output signal.

16. The method of claim 14, wherein the second EVB side comprises a populated frontside of the EVB, while the first EVB side comprises a non-populated underside of the EVB located opposing the populated frontside of the EVB; and
    wherein the method further comprising tuning the sample electronic module by accessing circuit components included in the sample electronic module through the EVB through-port and from the populated frontside of the EVB.

17. The method of claim 16, further comprising:
    obtaining an EVB baseplate having a baseplate through-port, the EVB baseplate configured to support the EVB when assembled into a module testing assembly with at least the EVB; and
    positioning the sample electronic module within the baseplate through-port when assembling the module testing assembly and after or concurrent with attaching the sample electronic module to the non-populated underside of the EVB.

18. The method of claim 14, wherein the first EVB side comprises a populated frontside of the EVB, while the second EVB side comprises a non-populated underside of the EVB located opposing the populated frontside of the EVB; and
    wherein the method further comprising tuning the sample electronic module by accessing circuit components included in the sample electronic module from the non-populated underside of the EVB through the EVB through-port.

19. The method of claim 18, further comprising obtaining an EVB baseplate having a baseplate through-port, the EVB baseplate configured to support the EVB when assembled into a module testing assembly with at least the EVB; and
    wherein tuning comprises tuning the sample electronic module by accessing circuit components included in the sample electronic module from the non-populated underside of the EVB through the EVB through-port and through the baseplate through-port.

\* \* \* \* \*